(12) United States Patent
Itoga et al.

(10) Patent No.: US 6,479,867 B2
(45) Date of Patent: Nov. 12, 2002

(54) THIN FILM TRANSISTOR

(75) Inventors: Toshihiko Itoga, Hino (JP); Takeo Shiba, Kodaira (JP); Makoto Ohkura, Fuchu (JP); Toshiki Kaneko, Chiba (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/940,538

(22) Filed: Aug. 29, 2001

(65) Prior Publication Data
US 2002/0074550 A1 Jun. 20, 2002

(30) Foreign Application Priority Data
Dec. 19, 2000 (JP) .......................................... 2000-384770

(51) Int. Cl.[7] .......................... H01L 27/01; H01L 27/12; H01L 31/0392
(52) U.S. Cl. ............................. 257/347; 257/59; 257/72
(58) Field of Search .............................. 257/57, 59, 66, 257/72, 347

(56) References Cited

U.S. PATENT DOCUMENTS

| | | | | |
|---|---|---|---|---|
| 5,917,225 A | * | 6/1999 | Yamazaki et al. | 257/411 |
| 5,936,278 A | * | 8/1999 | Hu et al. | 257/336 |
| 5,962,872 A | * | 10/1999 | Zhang et al. | 257/66 |
| 5,998,840 A | * | 12/1999 | Kim | 257/349 |
| 6,211,535 B1 | * | 4/2001 | Yamamoto et al. | 257/66 |
| 6,288,425 B1 | * | 9/2001 | Adan | 257/347 |
| 6,335,555 B1 | * | 1/2002 | Takemura et al. | 257/408 |

FOREIGN PATENT DOCUMENTS

| | | |
|---|---|---|
| JP | 7-202210 | 8/1995 |
| JP | 11-160736 | 6/1999 |
| JP | 2948965 | 7/1999 |

OTHER PUBLICATIONS

D. Brice, "Recoil Contribution to Ion–Implantation Energy–Deposition Distributions", *Journal of Applied Physics*, vol. 46, No. 8, Aug. 1975, pp. 3385–3394.

* cited by examiner

Primary Examiner—Ngan V. Ngo
(74) Attorney, Agent, or Firm—Miles & Stockbridge P.C.

(57) ABSTRACT

A thin film transistor of high reliability mounted on an insulator substrate, the transistor having a semiconductor thin film, a gate insulation film and a gate electrode in which the concentration profile of impurities in the semiconductor thin film is controlled so as to have a peak in a region other than the center of the depth for the semiconductor thin film to attain a long life for LCD.

25 Claims, 23 Drawing Sheets

NMOS

PMOS

NMOS

PMOS

THIN FILM TRANSISTOR

BACKGROUND OF THE INVENTION

This invention relates to a thin film transistor. In particular, this invention is suitable for use in a thin film transistor for an image display device driver and peripheral circuits thereof. This invention is effective particularly to the structure of a polycrystal silicon thin film transistor manufactured at a low temperature process but it is not restricted only thereto and is applicable, for example, also to a device so-called high temperature polysilicon thin film transistor.

The structure of an existent thin film transistor (hereinafter simply referred to as TFT) for use in a liquid crystal display (hereinafter referred to as LCD) is described in, for example, Japanese Patent No. 2948965. This is an example of a thin film transistor in which a lightly doped domain (hereinafter simply referred to as LDD) is formed to a source-drain region (hereinafter simply referred to as LDD TFT). At present, such a structure is general for use in display. Further, as described in, for example, Japanese Patent Laid-open Hei 7-202210, a TFT of a structure in which a gate electrode is overlapped to the LDD portion (Gate Overlapped LDD (hereinafter simply referred to as GOLD)) is also used. As a method of manufacturing LDD TFT, the following manufacturing method has been known. When a gate electrode is processed using a resist mask, the gate electrode is etched laterally (side etching), and then a resist is baked. Thereafter, impurity is doped to the source-drain using the resist as a mask and doping is conducted to the LDD portion after removal of the resist.

Further, it is a general method of conducting doping to LDD after processing the gate electrode, then forming an insulation film layer (side wall) only on the side wall of the gate electrode and conducting doping to the source-drain region in this state. Such a method is described in, for example, Japanese Patent Laid-open Hei 11-160736.

On the other hand, in GOLD TFT, a step of conducting the doping to the LDD portion simultaneously by ion implantation to the source-drain after processing the gate electrode in a convex shape is also adopted. This is described in, for example, Japanese Patent Laid-open Hei 7-202210.

SUMMARY OF THE INVENTION

An object of this invention is to provide a low temperature polysilicon TFT capable of ensuring a high reliability over a long period of time. Another object of this invention is to consistently provide a low temperature polysilicon TFT capable of ensuring high reliability for such a long period of time. Thus, LCD of high reliability can be supplied consistently.

The prior arts described above involve the following drawbacks. A first problem in the prior art is that damages increase upon doping to a gate oxide film/semiconductor interface when doping is applied to the LDD portion. This is attributable to a failure to consider the dopant profile in the direction of the depth in a semiconductor thin film in this case. For example, assume a case in which the gate insulation film comprises $SiO_2$ and the semiconductor thin film comprises Si. In a case where doping is applied by ion implantation or ion doping to the Si thin film, when doping is applied such that the concentration peak of the dopant is at the center of the semiconductor thin film, the amount of damage upon doping has a peak in $SiO_2$ at a shallower region, or near the $SiO_2$/Si interface. Usually, doping is conducted under such a condition. This is because such damage exhibits a peak at the depth 70 to 80% of the depth of the concentration peak in ion implantation with about 100 keV. This is reported in, for example, Journal of Applied Physics (D. K. Brice: J. Appl. Phys.), Vol 46, p 3385 (1975).

Similar damages may also be considered in the ion doping. In the TFT manufacturing process using polysilicon formed at low temperatures, the maximum heat treatment temperature is about 600° C. at the highest. The damage in $SiO_2$ or at the $SiO_2$/Si interface caused by doping is not recovered completely at this temperature. Usually, the damage is terminated by termination with nitrogen from an SiN film in the passivation step and electrically inactivated.

However, since the terminated defects are again activated electrically by hot carriers generated during operation of TFT, the oxide film and the interface containing much ion implantation damage tends to be degraded during use of TFT. Accordingly, this causes shortening of the LCD life. Therefore, it is difficult to consistently obtain an LCD of high reliability using a low temperature polysilicon TFT by the existent LDD manufacturing method.

On the other hand, in the method in which the gate electrode is formed in a convex shape and doping to the source-drain and LDD is collectively conducted, there has arisen a problem that the LDD concentration tends to be varied. For the film thickness in the thin portion of the gate electrode, variation by about several percent is inevitably formed in a substrate due to variation in a dry etching process or the like. In this case, concentration in the LDD portion varies by about 10%. This is due to the fact that the dopant concentration in the source-drain region is $1 \times 10^{20}/cm^3$ or more, whereas the dopant concentration in the LDD portion is about $1 \times 10^{17}/cm^3$–$1 \times 10^{20}/cm^3$ and dopings different in the concentration by two orders of magnitude or more are conducted collectively.

The basic concept of this invention can be expressed as below.

A first typical aspect of this invention is a thin film transistor mounted on an insulator substrate, the thin film transistor comprising a semiconductor thin film, a gate insulation film formed in contact with the semiconductor thin film and a gate electrode, in which the semiconductor thin film has a first impurity region and a second impurity region opposed to each other, and has a third impurity region disposed adjacent to at least one of the first impurity region or the second impurity region, the impurity concentration in the third impurity region is lower than the impurity concentration of the first impurity region or the second impurity region, and the concentration distribution in the third impurity region in the direction crossing the insulator substrate is minimum or maximum near an interface between the gate insulation film and the semiconductor thin film in the semiconductor thin film.

A second aspect of this invention is a thin film transistor mounted on an insulator substrate, the thin film transistor comprising a semiconductor thin film formed adjacent to the insulator substrate, a gate insulation film and a gate electrode, in which the semiconductor thin film has a first impurity region and a second impurity region opposed to each other and a third impurity region disposed adjacent to at least one of the first impurity region or the second impurity region, the impurity concentration of the third impurity region is an impurity concentration lower than the impurity concentration of the first impurity region or the second impurity region, and the distribution of the concentration of the impurity concentration in the third impurity region in the direction crossing the insulator substrate is minimum or maximum near an interface between the gate insulation film and the semiconductor thin film in the semiconductor thin film.

It is often preferable that a minimum or maximum level for the distribution of the impurity concentration in the third impurity region is present within a range of about ⅓ of the thickness of the semiconductor thin film with respect to an interface between the gate insulation film and the semiconductor thin film or an interface between the insulator substrate and the semiconductor thin film.

Further, another aspect in which at least one insulation layer or a desired member is disposed between the insulator substrate and the thin film transistor may also be considered. That is, the thin film transistor may be formed regarding a member formed with at least one insulation layer or the desired member as an insulator substrate. The aspect in which at least one insulation layer is disposed between the insulator substrate and the thin film transistor is useful for favorably forming a semiconductor thin film to be mounted on the insulation substrate. Further, doping to the third impurity region is preferably conducted separately from the doping to the first and second impurity regions.

Damage caused by the doping in the LDD portion can be decreased by conducting doping while changing the position for the concentration peak of the concentration profile in the direction of the depth during doping from the existent center for the semiconductor thin film toward the gate insulation film/semiconductor thin film interface or toward the semiconductor thin film/insulator substrate interface in the semiconductor thin film. In this case, when an insulation film is formed on the insulator substrate, the position is changed toward the interface between the semiconductor thin film and the insulation film. The peak position of the dopant, in the laminate is not restricted to in the semiconductor thin film but may be in the gate insulation film, in the insulator substrate or in the insulation film formed on the insulator substrate, and a similar effect can be obtained when it is present also at the interface between the semiconductor thin film and them. It should be noted that the wording of "gate insulation film/semiconductor thin film" or the like shows that the gate insulation film and the semiconductor thin film are formed adjacent to each other, that is, they are laminated for example.

DESCRIPTION OF THE PREFERRED EMBODIMENTS

Figure 1:
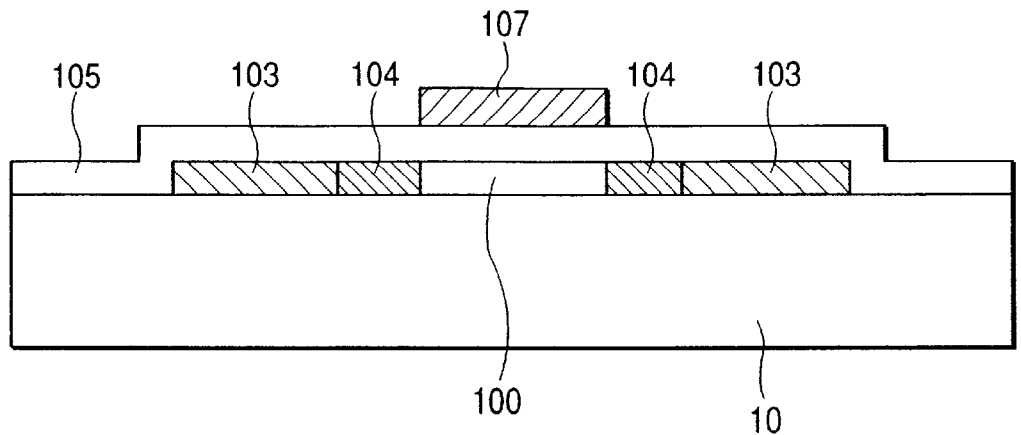
FIG. 1 is a cross-sectional view of a typical thin film transistor according to this invention.

At first, details of the concentration profile in this invention are to be described with reference to FIGS. 1 to 6. FIG. 1 is a schematic cross-sectional view for the cross section of a top gate type TFT up to a step of preparing a gate electrode. Various types of concentration profiles in the direction of depth for damage caused by dopant and doping to the structure of the LDD portion are shown in FIGS. 2 to 6.

FIG. 1 shows a thin film transistor portion with wirings and the like other portions being omitted. A semiconductor thin film 100 is formed on an insulative substrate 10 in which first and second impurity regions 103 and a third impurity region 104 at an impurity concentration lower than those of the first and the second impurity regions are formed. As has been described above, the region as charge transporting and receiving means are usually referred to as LDD. An insulation film 105 as a gate insulation film is disposed on the semiconductor thin film 100 and a gate electrode 107 is disposed by way of the insulation film 105.

Figure 2:
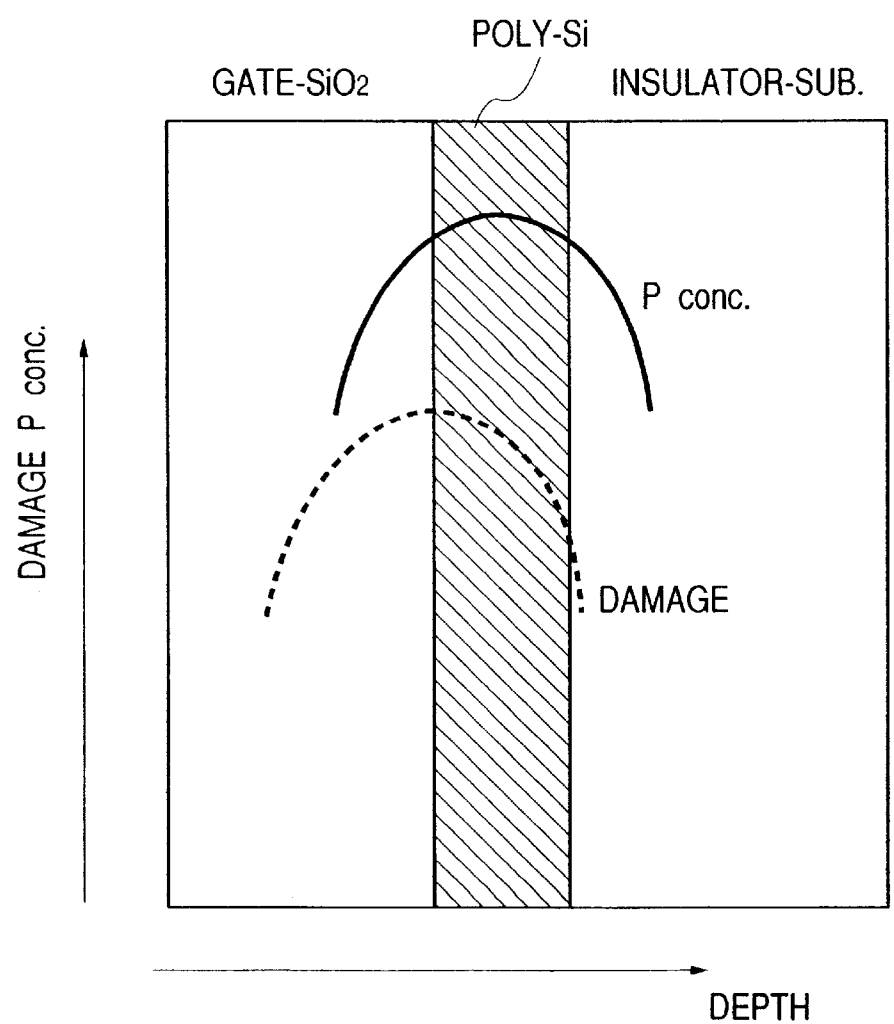
FIG. 2 is a diagram of a dopant profile and a damage profile in an LDD portion of TFT of an existent structure.

FIG. 2 is a diagram showing the profile of a P (phosphorus) concentration together with a depth profile of damage upon prior art P (phosphorus) doping to an LDD portion. The abscissa denotes the depth in a laminate of a gate insulation film, a poly-Si layer and an insulation substrate, and the ordinate indicates the degree of the P concentration and the damage, that is, the defect density.

In this example, the thickness of the gate $SiO_2$ film is 100 nm and that of poly-Si as the semiconductor thin film is 50 nm. In this example, doping is conducted by mass separation type ion implantation.

Figure 3:
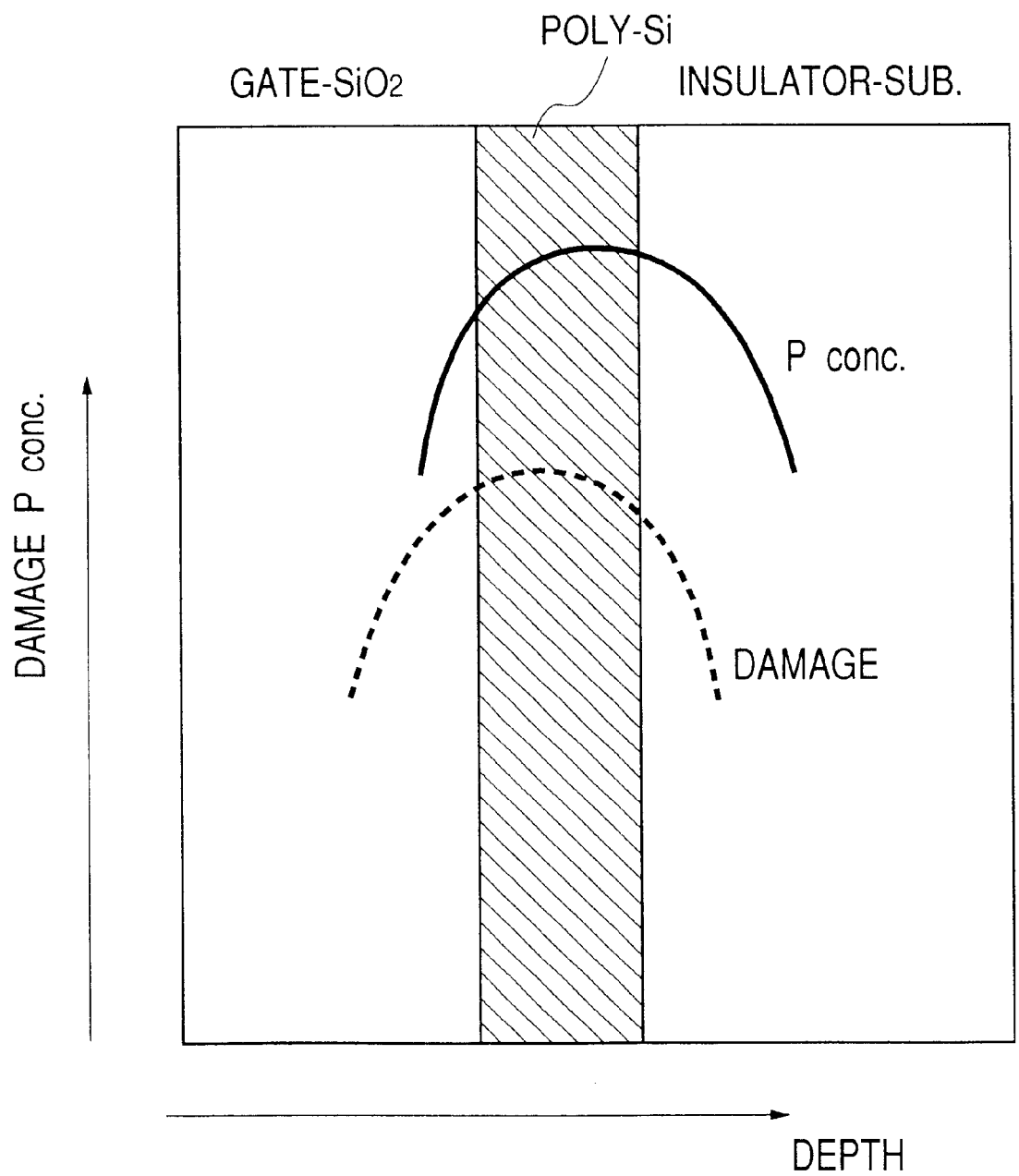
FIG. 3 is a diagram of a dopant profile and a damage profile in an LDD portion of TFT according to this invention.
Figure 4:
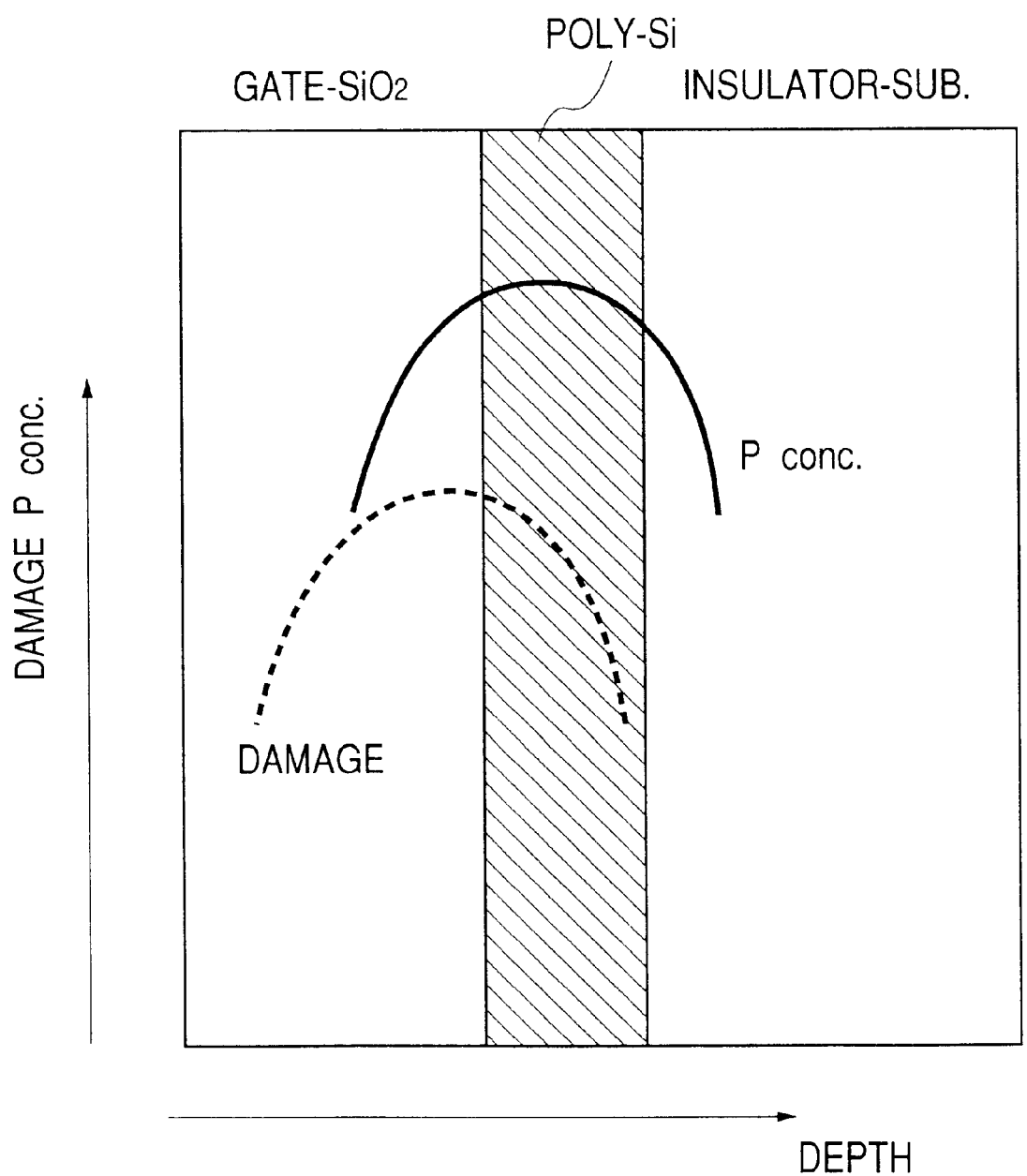
FIG. 4 is a diagram of another dopant profile and damage profile in an LDD portion of TFT according to this invention.

In the prior art shown in FIG. 2, the P concentration peak is present at the center of poly-Si and the concentration peak of the damage is present near the gate $SiO_2$/poly-Si interface which is at 70%–80% depth of the P concentration peak. In this case, the damage in the $SiO_2$ film near the interface approximately takes a maximum value. In FIG. 3, for one embodiment of this invention, while the P concentration peak is present in poly-Si, the peak position situates on the side of the poly-Si/insulator substrate interface, so that the damage near the gate $SiO_2$/poly-Si interface can be decreased relative to that in the case of FIG. 2. A similar effect can also be obtained by locating the P concentration peak on the side of the gate $SiO_2$/poly-Si interface as shown in FIG. 4. In particular, in the concentration profile as shown in FIG. 3, since the P concentration decreases toward the gate $SiO_2$/poly-Si interface, electrons flowing during operation of TFT flow at a position away from the interface. Accordingly, a position where the hot carriers degrading $SiO_2$ film characteristic are generated also shifts away from the interface. With this effect, the number of hot carriers injected to the $SiO_2$ film near the interface is decreased to result in an effect of improving the reliability of TFT.

Figure 5:
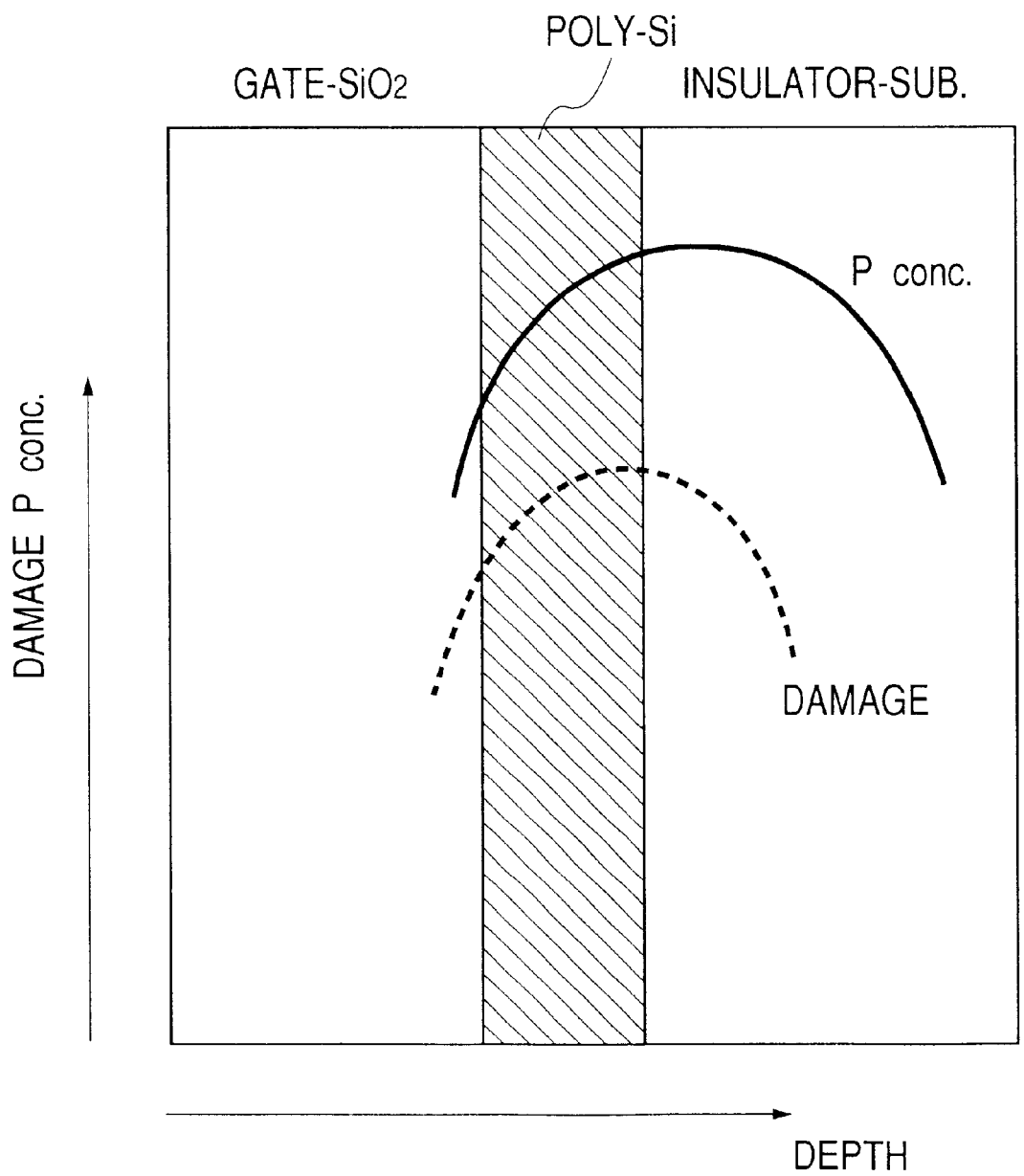
FIG. 5 is a diagram of another dopant profile and damage profile in an LDD portion of TFT according to this invention.

FIG. 5 shows a case of doping such that the P concentration has a peak in the insulation substrate. Damage near the gate $SiO_2$/poly-Si interface is decreased greatly and it has an effect greater than that in the case of FIG. 3 with a view point of decreasing damage. However, since the P concentration in the poly-Si film is also decreased, the amount of doping has to be increased compared with a case where the peak is present at the center of poly-Si. In the case of FIG. 5, the effect of decreasing the hot carrier injection described above is large and the effect of improving the reliability of TFT is also large.

Figure 6:
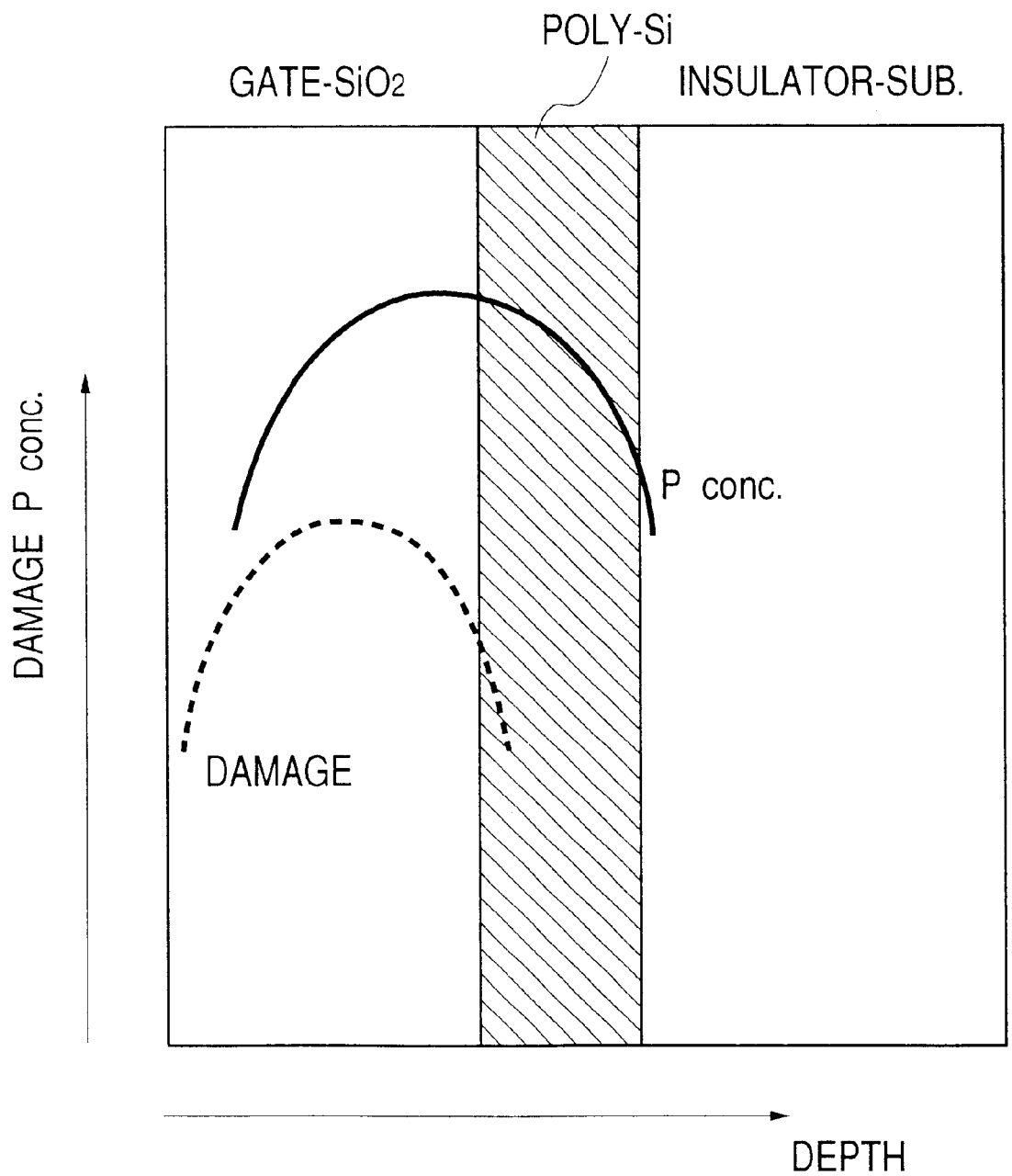
FIG. 6 is a diagram of another dopant profile and damage profile in an LDD portion of TFT according to this invention.
Figure 7A:
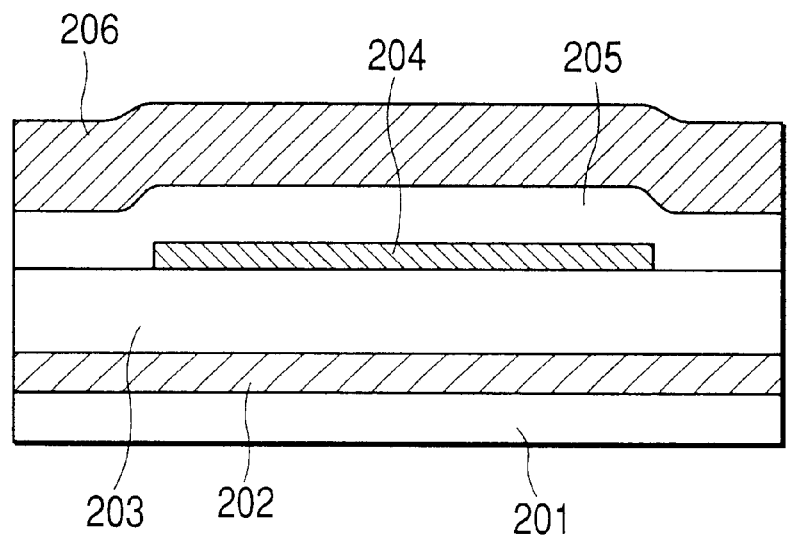
FIGS. 7(a) and 7(b) are cross-sectional views of one step in the order of manufacturing steps for one embodiment of a first TFT according to this invention.
Figure 7B:
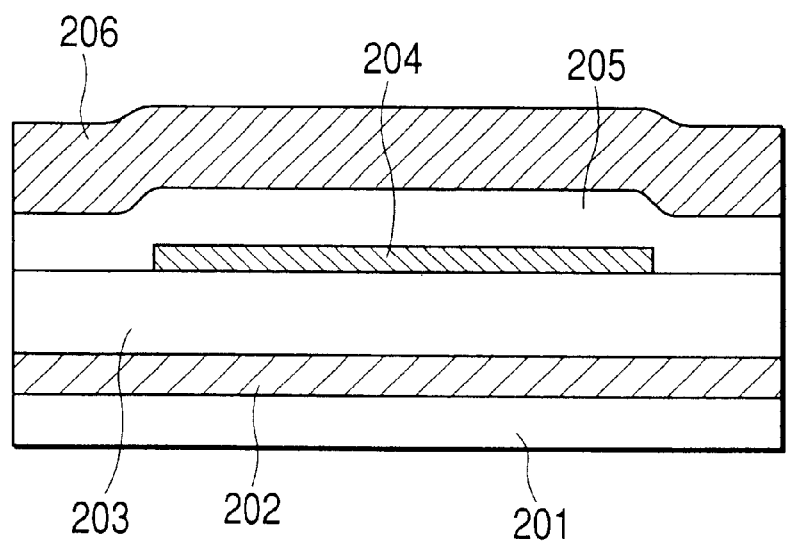

FIG. 6 shows a case in which the peak position of the P concentration is located in the $SiO_2$ film. In this case, the amount of damage near the gate $SiO_2$/poly-Si interface can be decreased extremely.

As has been described above, the damage caused by doping and introduced to the gate insulation film/semiconductor thin film interface can be decreased by controlling the concentration profile of P doped to the LDD, to thereby obtain TFT of high reliability.

Further, in the case of TFT of GOLD structure, concentration in the LDD portion can be controlled at a high accuracy by processing a gate electrode into a convex shape and conducting doping to the source-drain region and doping to the LDD portion separately instead of collectively conducting doping for source-drain and LDD. Further, damages caused by doping can be decreased by changing the position of the concentration peak in the direction of the depth of the dopant in LDD from the center of the semiconductor thin film in the same manner as the case described above.

As has been described above, an embodiment is frequently adopted in which a maximum or minimum value for the distribution of the impurity concentration in the third impurity region is present within a range of about ⅕ of the thickness of the semiconductor thin film with respect to the interface between the gate insulation film and the semiconductor thin film or the interface between the insulator substrate and the semiconductor thin film. In this invention a semiconductor thin film with a thickness, for example, of about 30nm to 60 nm is often used. In such a case, the peak of the impurity concentration is set within the range of about 6 nm to 12 nm from the interface relative to the film thickness.

Next, prior to description of specific exemplary embodiments of this invention, principal modes of this invention will be enumerated below.

A first mode of this invention is a thin film transistor formed on an insulator substrate. The thin film transistor includes, at least, a semiconductor thin film, a gate insulation film and a gate electrode and has a third region adjacent to at least one of a source region or a drain region of the transistor and having a dopant concentration lower than n a dopant concentration of the source and the drain regions. The dopant concentration in the third region has a distribution in the direction of the depth in the semiconductor thin film, and the distribution of the dopant concentration in the direction of the depth in the semiconductor thin film is minimum or maximum in the semiconductor thin film near the gate insulation film/semiconductor thin film interface.

A second mode of this invention is a thin film transistor formed on an insulator substrate. The thin film transistor includes, at least, a semiconductor thin film, a gate insulation film and a gate electrode and has a third region adjacent to at least one of a source region or a drain region of the transistor and having a dopant concentration lower than the dopant concentration for the source and drain regions. The dopant concentration in the third region has a distribution in the direction of the depth in the semiconductor thin film, and the distribution of the dopant concentration in the direction of the depth in the semiconductor thin film is minimum or maximum in the semiconductor thin film near the insulator substrate/semiconductor thin film interface.

A third mode of this invention is a thin film transistor formed on an insulator substrate in which at least one insulation film is formed between the insulator substrate and the thin film transistor. The thin film transistor includes at least, a semiconductor thin film, a gate insulation film and a gate electrode and has a third region adjacent to at least one of a source region or drain region of the transistor. The third region has a dopant concentration lower than those of the source and drain regions. The dopant concentration in the third region has a distribution in the direction of the depth in the semiconductor thin film, and the distribution of the dopant concentration in the direction of the depth in the semiconductor thin film is minimum or maximum in the semiconductor thin film near the gate insulation film/semiconductor thin film interface.

A fourth mode of this invention is a thin film transistor formed on an insulator substrate in which at least one insulation film is formed between the insulator substrate and thin film transistor. The thin film transistor includes, at least, a semiconductor thin film, a gate insulation film and a gate electrode and has a third region adjacent to at least one of source or drain region of the transistor. The third region has a dopant concentration lower than those of the source and drain regions. The dopant concentration in the thir region has a distribution in the direction of the depth in the semiconductor thin film, and the distribution of the dopant concentration in the direction of the depth in the semiconductor thin film is minimum or maximum in the semiconductor thin film near the semiconductor thin film/insulation film interface.

A fifth mode according to this invention is a thin film transistor as defined in any one of first to fourth modes described above in which doping to the third region is conducted separately from the doping to the source and drain regions.

A sixth mode according to this invention is a thin film transistor formed on an insulator substrate. The thin film transistor includes, at least, a semiconductor thin film, a gate insulation film and a gate electrode and has a third region adjacent to at least one of a source region or a drain region of the transistor. The third region has a dopant concentration lower than those of the source and drain regions, and at least a portion of the gate electrode covers the third region. Doping to the third region is conducted separately from the doping to the source and drain regions.

A seventh mode according to this invention is a thin film transistor as defined in any one of items first to fifth described above wherein at least a portion of the gate electrode overlaps on the third region.

An eighth mode according to this invention is a thin film transistor formed on an insulator substrate. The thin film transistor includes, at least, a semiconductor thin film, a gate insulation film and a gate electrode and has a third region adjacent to at least one of a source region or a drain region of the transistor. The third region has a dopant concentration lower than those of the source and drain regions. The dopant concentration in the third region has a distribution in the direction of the depth in the semiconductor thin film, and the distribution of the dopant concentration in the direction of the depth in the semiconductor thin film is minimum in the semiconductor thin film near a gate insulation film/ semiconductor thin film interface, increases continuously toward the semiconductor thin film/insulator substrate interface, and is maximum in the semiconductor thin film near the semiconductor thin film/insulator substrate interface.

A ninth mode according to this invention is a thin film transistor formed on an insulator substrate. The thin film transistor includes, at least, a semiconductor thin film, a gate insulation film and a gate electrode and has a third region adjacent to at least one region of a source region or a drain region of the transistor. The third region has a dopant concentration lower than those of the source and drain regions. The dopant concentration in the third region has a distribution in the direction of the depth in the semiconductor thin film, and the distribution of the dopant concentration in the direction of the depth in the semiconductor thin film is maximum in the semiconductor thin film near a gate insulation film/semiconductor thin film interface, decreases continuously toward a semiconductor thin film/insulator substrate interface and i minimum in the semiconductor thin film near the semiconductor thin film/insulator substrate interface.

A tenth mode according to this invention is a thin film transistor formed on an insulator substrate, in which at least one layer of insulation film is formed between the insulator substrate and the thin film transistor. The transistor includes, at least, a semiconductor thin film, a gate insulation film and a gate electrode and has a third region adjacent to at least one of a source region or a drain region. The third region has a dopant concentration lower than those of the source and drain regions. The dopant concentration in the third region has a distribution in the direction of the depth in the semiconductor thin film, and the distribution of the dopant concentration in the direction of the depth in the semiconductor thin film is minimum in the semiconductor thin film near a gate insulation film/semiconductor thin film interface, increases continuously toward the interface with the insulation film formed on a semiconductor thin film/insulator substrate and is a maximum in the semiconductor thin film near the interface with the insulation film formed on the semiconductor thin film/insulator substrate.

An eleventh mode according to this invention is a thin film transistor formed on an insulator substrate, in which at least one layer of insulation film is formed between the insulator substrate and the thin film transistor. The transistor includes, at least, a semiconductor thin film, a gate insulation film and a gate electrode and has a third region adjacent to at least one of a source region or a drain region. The third region has a dopant concentration lower than those of the source region or the drain region. The dopant concentration in the third region has a distribution in the direction of the depth in the semiconductor thin film, and the distribution of the dopant concentration in the direction of the depth in the semiconductor thin film is maximum in the semiconductor thin film near a gate insulation film/semiconductor thin film interface, decreases continuously toward the interface with the insulation film formed on the semiconductor thin film/ insulator substrate and is minimum in the semiconductor thin film near the interface with the insulation film formed on the semiconductor thin film/insulator substrate.

A twelfth mode according to this invention is a thin film transistor as in any one of modes eighth to eleventh described above, wherein doping to the third region is conducted separately from the doping to the source and drain regions.

A thirteenth mode according to this invention is a thin film transistor as in any one of modes eighth to twelfth described above, wherein at least a portion of the gate electrode overlaps on the third region.

Embodiment 1

FIGS. 7 to 14 are cross-sectional views of a CMOS TFT device to which this invention is applied, in the order of manufacturing steps. In each of the figures, (a) on the upper portion shows a state of a region of NMOS and (b) on the lower portion shows a state of a region of PMOS. In the figures, respective MOS regions are illustrated separately but it will be apparent that they are manufactured on one identical substrate in an actual device.

On a glass substrate 201, an SiN film 202 and an $SiO_2$ film 203 were formed to thicknesses of 100 nm and 200 nm, respectively, as under layers by PE-CVD (Plasma Enhanced—Chemical Vapor Deposition). Subsequently, an a-Si (amorphous silicon) film 204 was deposited by 50 nm by a PE-CVD method, and the a-Si film was annealed by an excimer laser to form a poly-Si (poly-silicon) film. The film was formed into an island shape at a desired position by dry etching using a resist mask. Subsequently, an $SiO_2$ film 205 of 100 nm thickness was formed as a gate insulation film by the PE-CVD method. Then, a gate electrode 206 of 150 nm thickness was formed on the $SiO_2$ film by a sputtering method. This is shown in FIG. 8.

In this embodiment, the NMOS region is formed at first and then the PMOS region is formed.

Figure 8A:
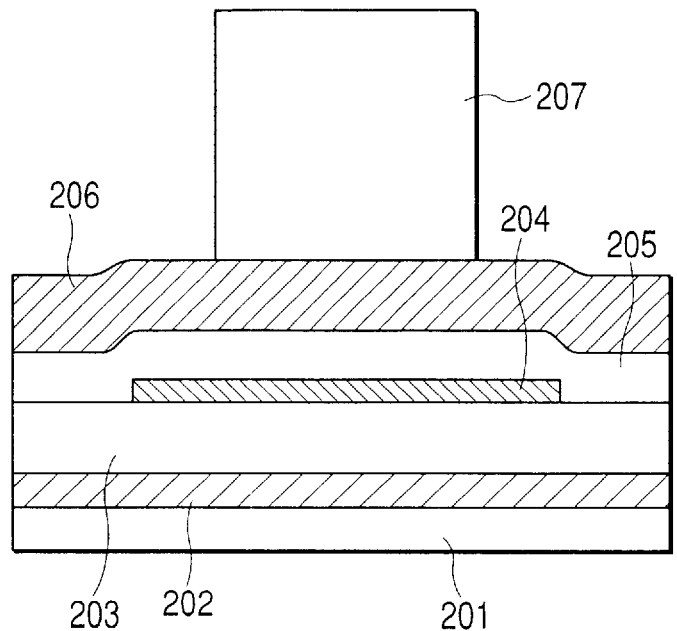
FIGS. 8(a) and 8(b) are cross-sectional views of another step in the order of manufacturing steps for one embodiment of a first TFT according to this invention.
Figure 8B:
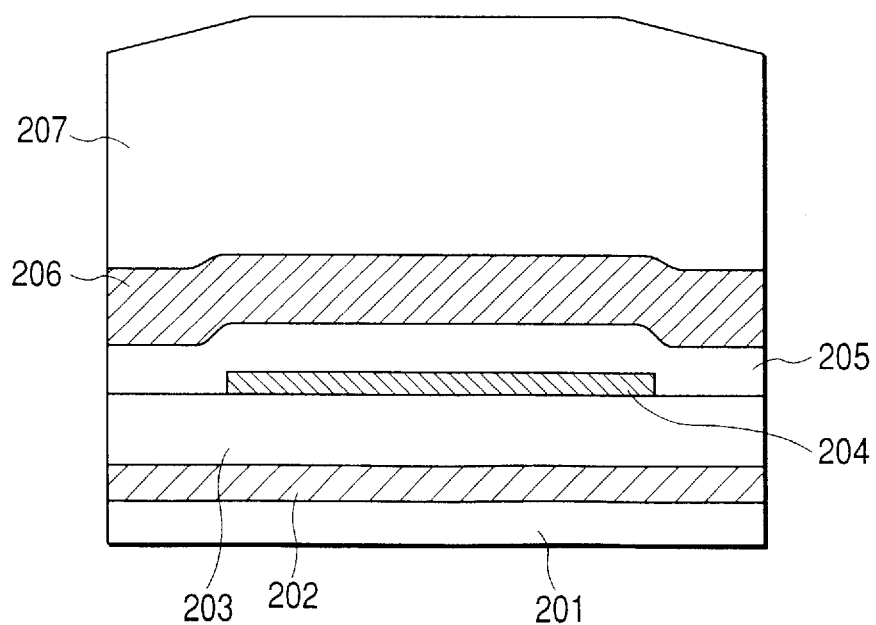
Figure 9A:
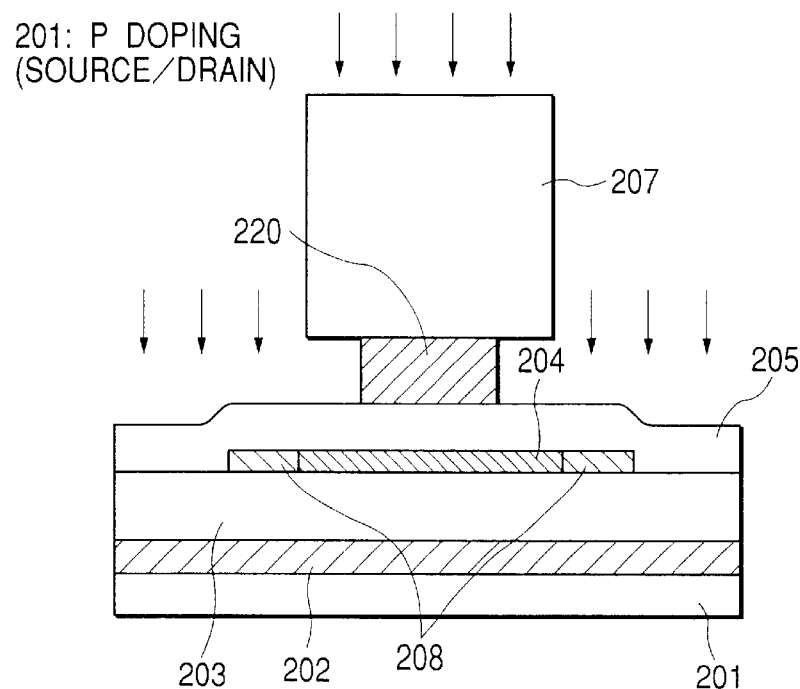
FIGS. 9(a) and 9(b) are cross-sectional views of a further step in the order of manufacturing steps for one embodiment of a first TFT according to this invention.
Figure 9B:
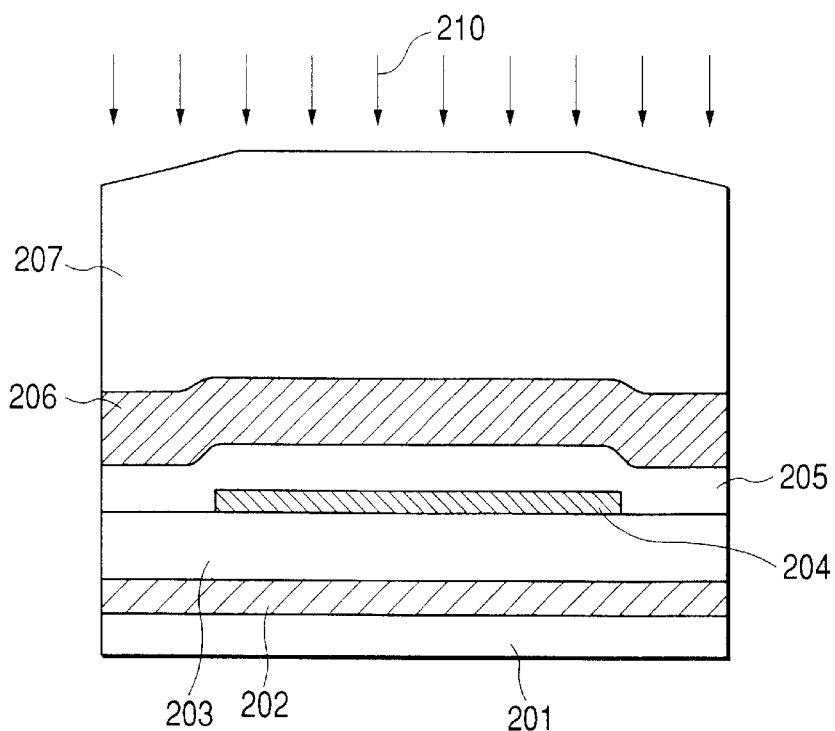
Figure 10A:
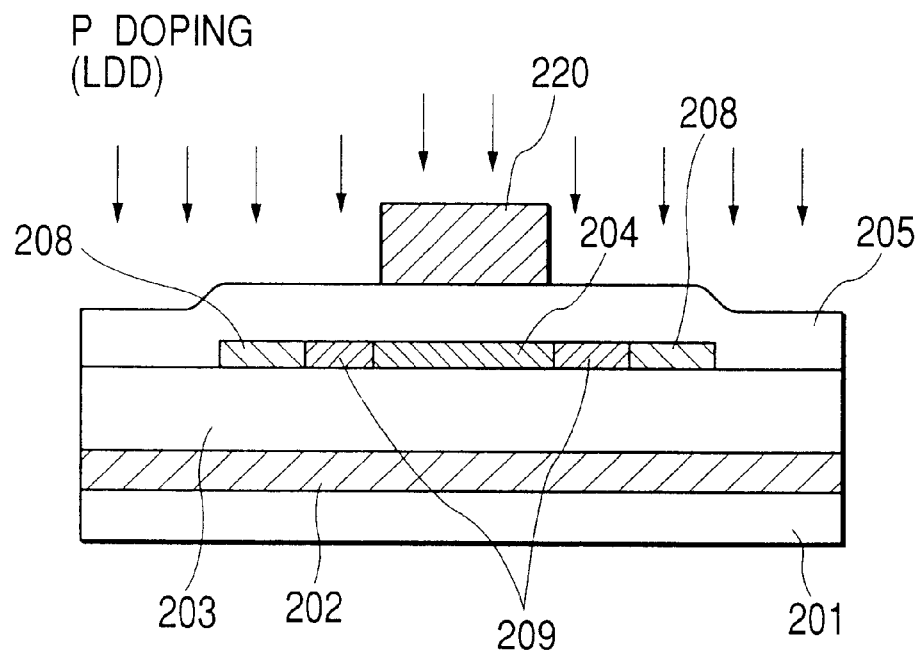
FIGS. 10(a) and 10(b) are cross-sectional views of a further step in the order of manufacturing steps for one embodiment of a first TFT according to this invention.
Figure 10B:
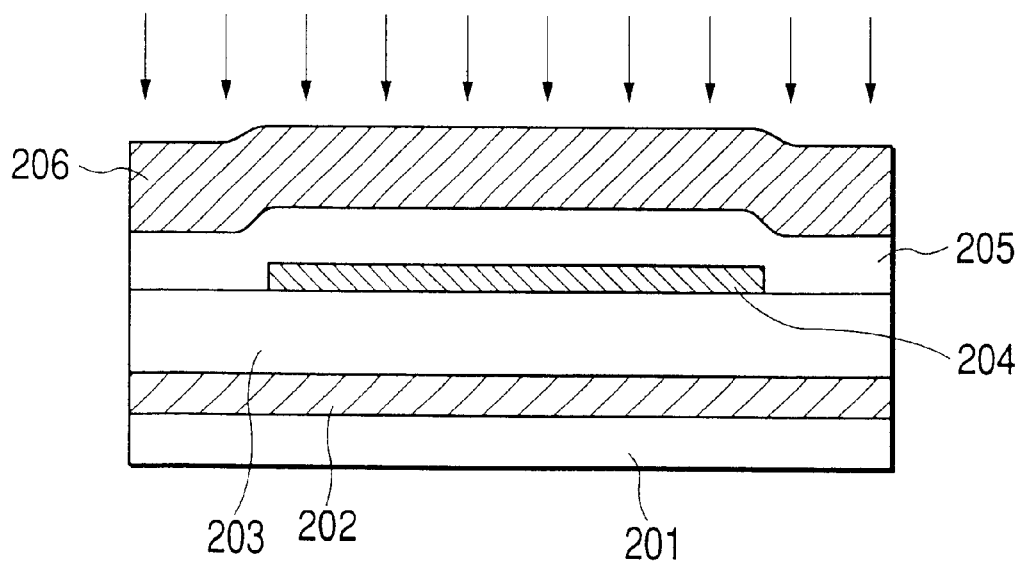

After the steps described above, a photoresist pattern 207 is form ed for the processing of electrode of the NMOS transistor (FIG. 8(a)). Accordingly, the PMOS region is covered with the photoresist as shown in FIG. 8(b). Then, a gate electrode 220 was treated with wet etching so as to form 1 μm side etching relative to the side of the resist (FIG. 9). P+ ions were ion implanted using the resist as a mask for the ion implantation to conduct doping for source-drain regions 208 of the NMOS transistor. The implantation was conducted under the condition at an acceleration voltage of 80 KeV with the dose rate of $1E15/cm^3$. As described above, the PMOS transistor region is masked by the resist upon the electrode process and the ion implantation. After the ion implantation, resist was removed by oxygen ($O_2$) plasma ashing. In this state, P+ ions were ion implanted at energy of 30 KeV to 120 KeV and doping was conducted to a so-called LDD portion 209 (FIG. 10).

Figure 11A:
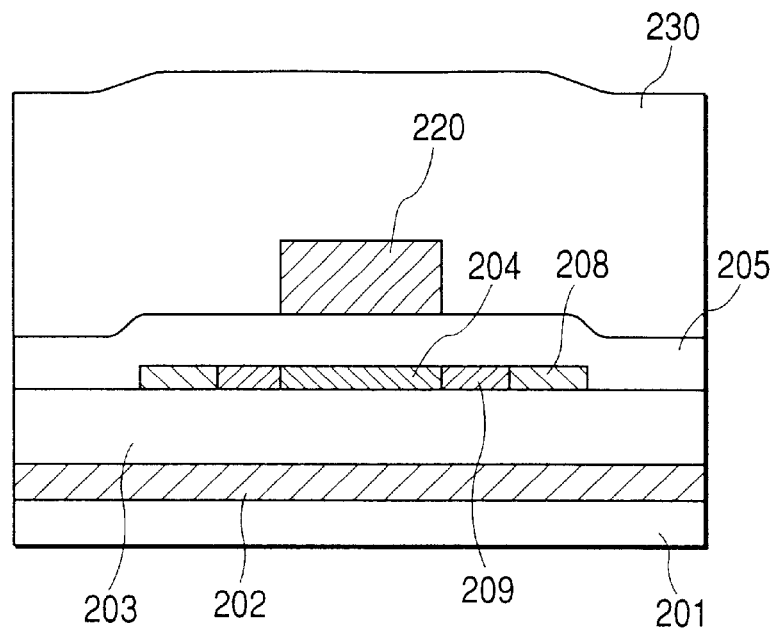
FIGS. 11(a) and 11(b) are cross-sectional views of a further step in the order of manufacturing steps for one embodiment of a first TFT according to this invention.
Figure 11B:
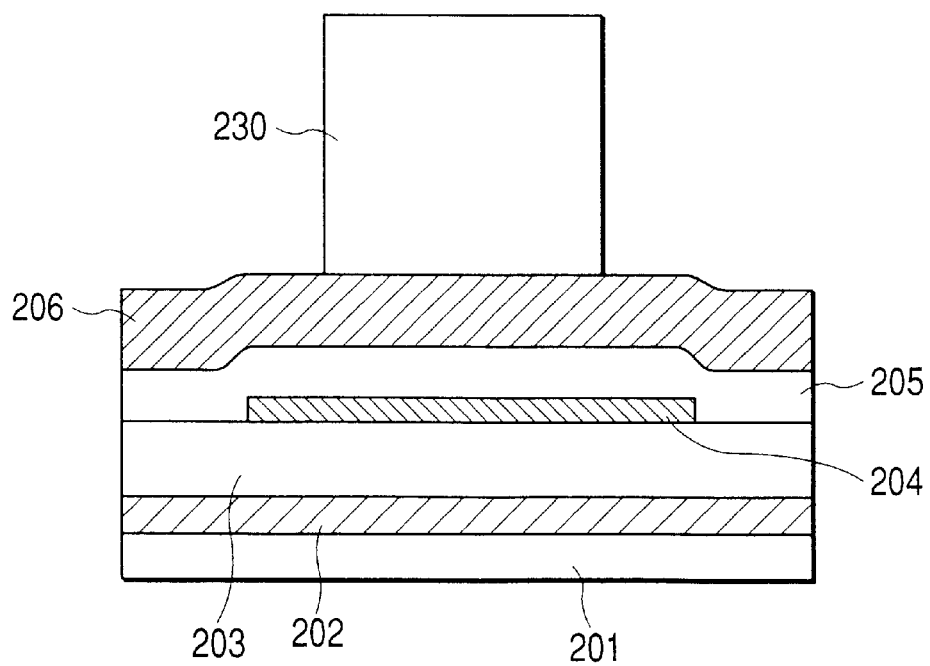
Figure 12A:
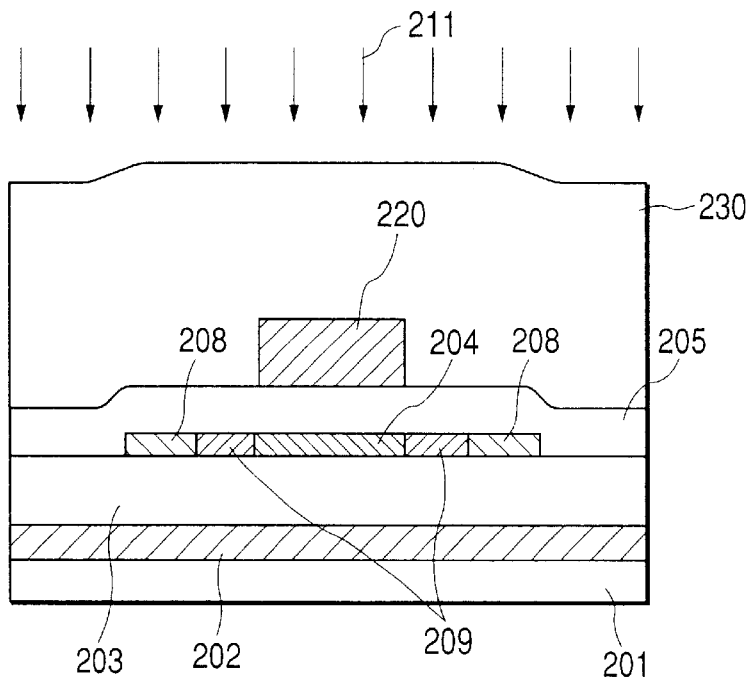
FIGS. 12(a) and 12(b) are cross-sectional views of a further step in the order of manufacturing steps for one embodiment of a first TFT according to this invention.
Figure 12B:
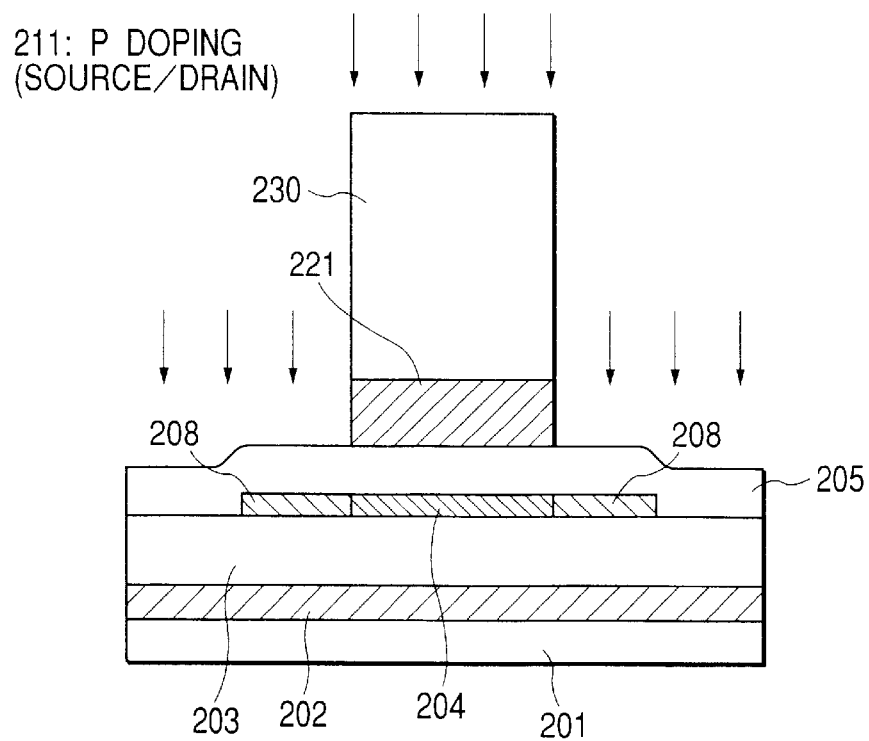
Figure 13A:
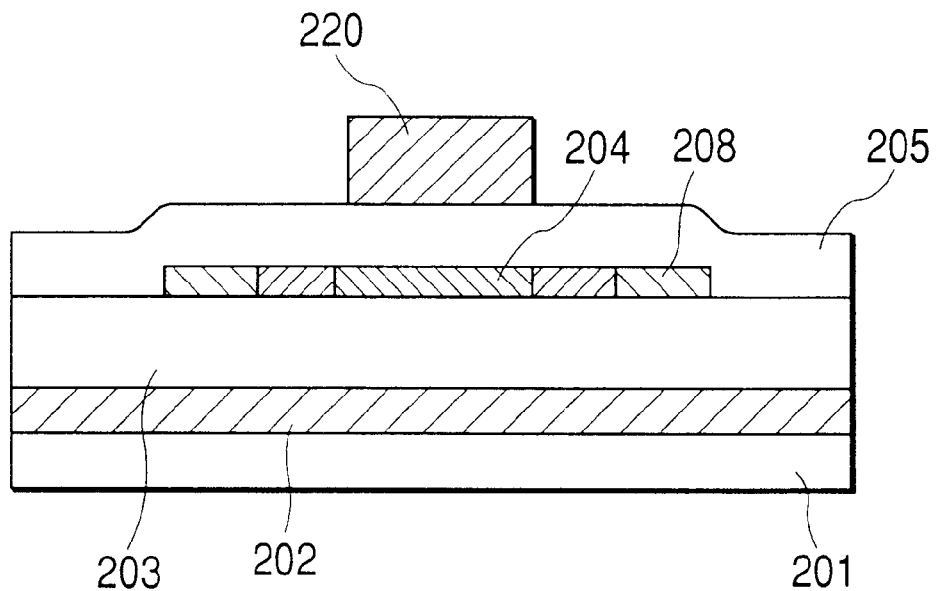
FIGS. 13(a) and 13(b) are cross-sectional views of a further step in the order of manufacturing steps for one embodiment of a first TFT according to this invention.
Figure 13B:
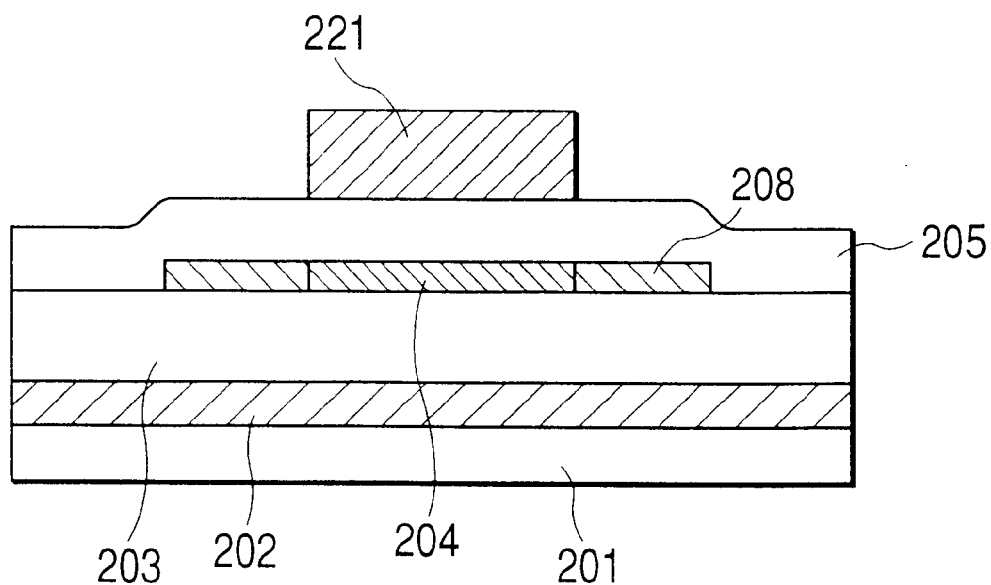

Succeeding to the NMOS transistor manufacturing step described above, the process goes to the formation of the PMOS region. A resist pattern 230 for the electrode processing of the PMOS transistor is formed on the substrate prepared up to this step (FIG. 11). Then, the gate electrode was fabricated by a so-called anisotropic dry etching. Dry etching was used in this step for fabricating the gate electrode of the PMOS transistor to the same size as that of the resist pattern. Thus, a transistor with no offset region can be manufactured. Since the offset region is not present, reduction of the ON-current of the PMOS transistor can be avoided. After the processing described above, B+ ions were ion implanted 211 to form source and drain regions 208 of the PMOS transistor (FIG. 12). In this embodiment, ion implantation was conducted under the condition at an acceleration voltage of 25 KeV with dose rate of $8\times10^{14}/cm^3$. The resist 230 used for the ion implantation was removed (FIG. 13). Then, heat treatment for the activation of the impurity was conducted by annealing at 600° C. for 5 hours in a nitrogen atmosphere.

Figure 14:
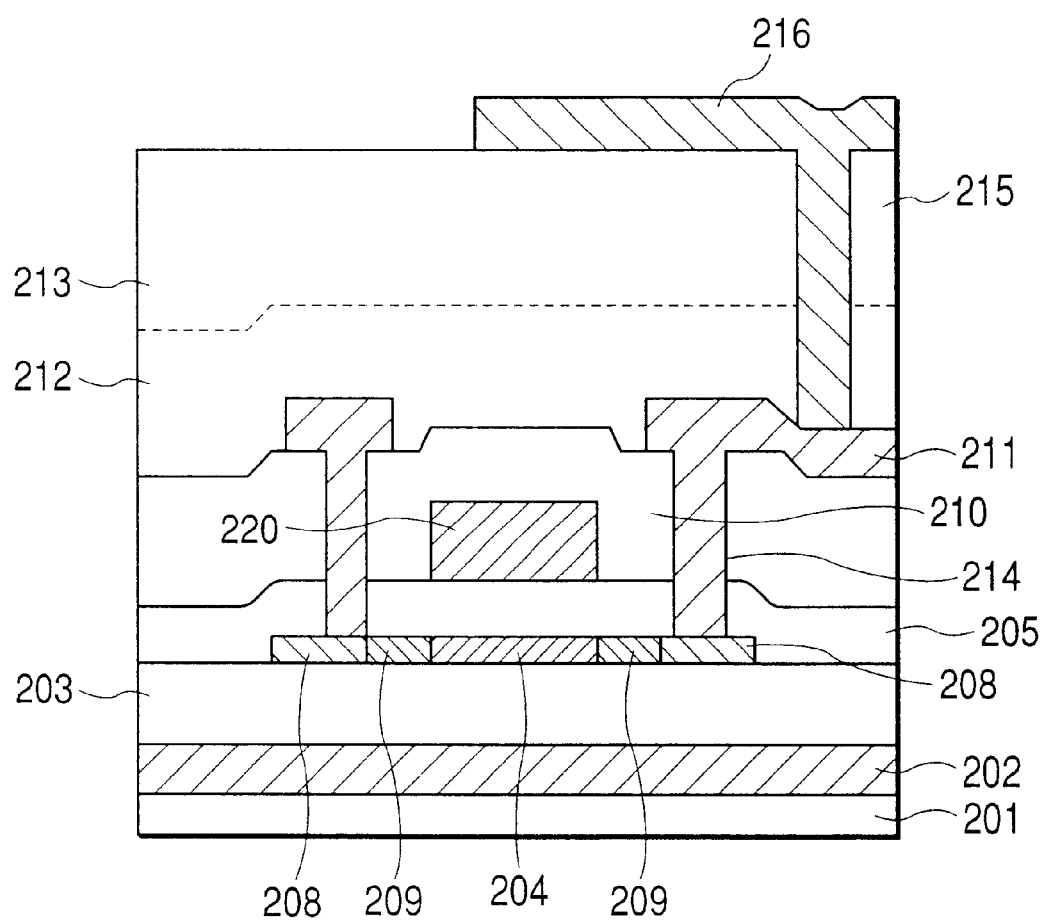
FIG. 14 is a cross-sectional view of a further step in the order of manufacturing steps for one embodiment of a first TFT according to this invention.

After forming the TFT region, wirings and transparent electrodes were formed by conventional methods. That is, an $SiO_2$ interlayer insulation film (500 nm) 210 was formed by a PE-CVD method. Then, the interlayer insulation film 210 was opened and wirings 211 were formed from an Al alloy through the openings 214. Further, an $SiO_2$ (500 nm) 212 and an SiN film (500 nm) 213 were formed as passivation films on the wirings by a PE-CVD method. Then, after forming a contact hole 215 in the insulation films, ITO (Indium Tin Oxide) 216 was formed as a transparent electrode (FIG. 14). In the figures, although only one cross section is illustrated, desired wirings corresponding to each of the transistors are formed. It will be apparent that electrode wirings are formed for the gate electrode in other cross section.

Figure 15:
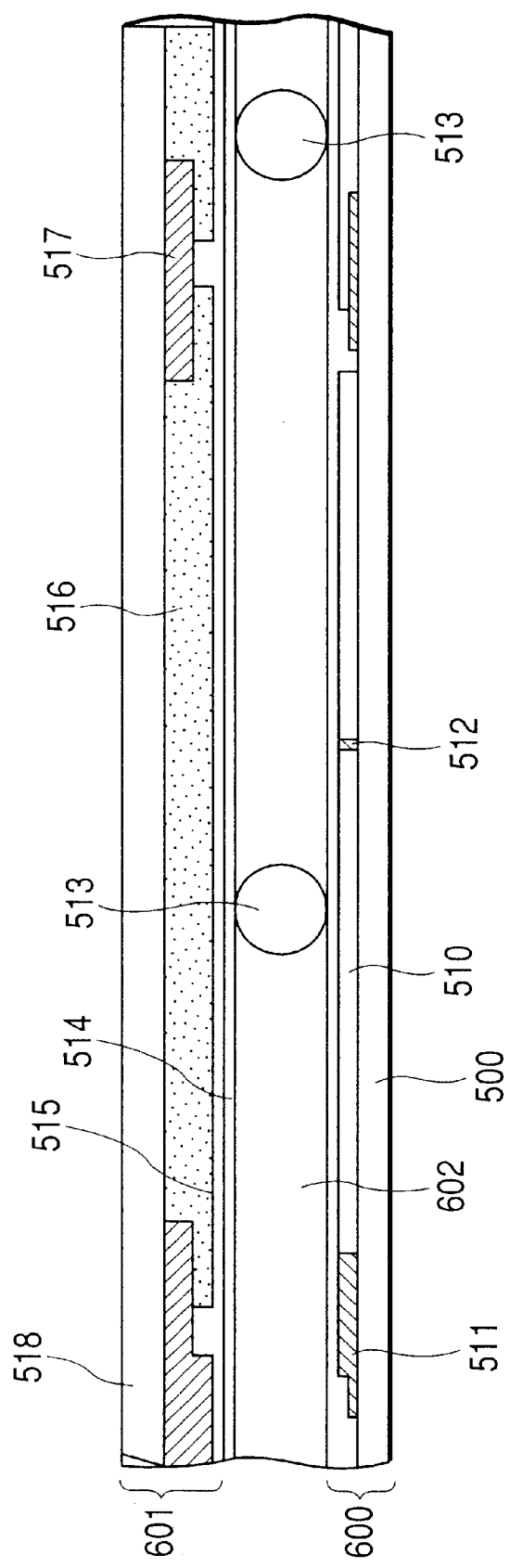
FIG. 15 is a cross-sectional view of an example of an LCD.

Thus, a transistor for driving liquid crystal and a CMOS transistor for circuits were formed. FIG. 15 shows a schematic cross sectional view of an LCD. The basic arrangement is identical to an ordinary one. That is, an ITO film is formed on a glass substrate 500. Then, TFT 511 connected as desired to the ITO film 500 is disposed. TFT 511 is a thin film transistor according to this invention. Then, an orientation film 512 is disposed on the thin film transistor to constitute a substrate 600. On the other hand, a black matrix material 517 is disposed to a glass substrate 518 mainly intended for the improvement of so-called contrast and, for example, a filter is disposed between the black matrix materials 517 to constitute a picture element 516. Then, an ITO film 515 and an orientation film 514 are formed on them to constitute the other substrate 601. Both of the substrates 600 and 601 are opposed to each other by way of a spacer and liquid crystal 602 is filled between them. Thus, a pixel portion of the LCD is manufactured. While an example for the planer constitution of the LCD is not illustrated, it can also be designed as desired by an ordinary method.

Figure 16:
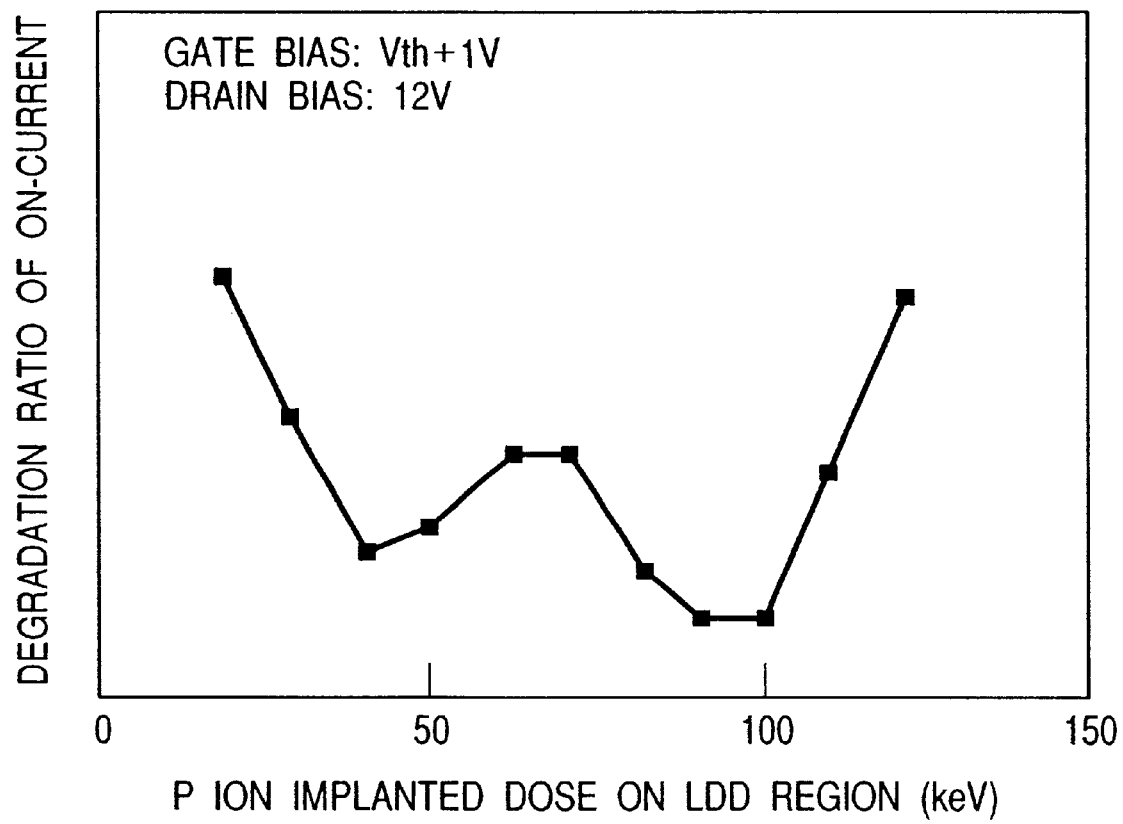
FIG. 16 is a graph showing the results of measurement for the reliability of a first TFT according to this invention.

FIG. 16 shows results of a stress test on the TFT thus manufactured. As shown in the figure, stressing conditions are that a gate voltage is higher than Vth by 1 V and a drain voltage is 12 V. The abscissa indicates an energy upon ion implantation to the LDD portion and the ordinate indicates the ratio of ON-current to an initial ON-current after applying the stress for 1000 seconds. This ratio corresponds to a so-called degradation rate. The degradation rate decreases along with increase of the ion implantation energy and reaches a minimum value at 40 KeV to 50 KeV.

As the energy increases further, the degradation rate rather increases, then decreases again and then increases subsequently again. This change can be considered as below. At the implantation energy of 50 KeV or less, since P is doped to the LDD portion to moderate an electric field under the application of stress along with increase of the energy, the degradation rate is decreased. When the energy increases to 60 KeV or more, since damage is introduced in $SiO_2$ near the gate $SiO_2$/poly-Si interface, the degradation rate increases. Then, when energy increases further, since damage s in $SiO_2$ near the interface is decreased, the degradation rate decreases. Then, when the energy increases to some extent, since the concentration of P doped to the LDD portion decreases greatly, the degradation rate tends to be increased again. As described above, TFT of high reliability could be obtained by controlling the ion implantation energy, to the LDD region, to 30 keV to 50 KeV and 90 KeV to 100 KeV in this case. The life of LCD products using the TFT manufactured within the range of the energy described above is $10^7$ sec or more. Accordingly, by using this invention, LCD of extremely high reliability could be obtained.

According to this invention, since damage in the LDD portion can be decreased, when phosphorus (P) in the LDD portion is activated by heat treatment, it can be activated efficiently at a lower temperature for a shorter period of time to also provide an advantage that the resistance of the LDD portion can be made uniform even by a heat treatment at a lower temperature for a shorter period of time. The concept of this invention is applicable also to the activation of the source-drain regions, and the source-drain region can be activated by heat treatment at a lower temperature for a shorter period of time by selecting an appropriate energy upon ion implantation to the source-drain region.

The doping method to the LDD portion described above is not restricted to the ion implantation but a similar effect can also be obtained in the case of using non mass separation type ion doping so long as the ion doping energy is optimized.

Embodiment 2

FIG. 17 to FIG. 23 illustrate cross sectional views for a device, in the order of manufacturing steps, of a second embodiment of a CMOS TFT applied with this invention. In each of the drawings, (a) on the upper portion shows the state of the NMOS region and (b) on the lower portion shows the state of the PMOS region. In the drawings, respective MOS regions are shown separately but it will be apparent that they are manufactured on one identical substrate in an actual device.

Figure 17A:
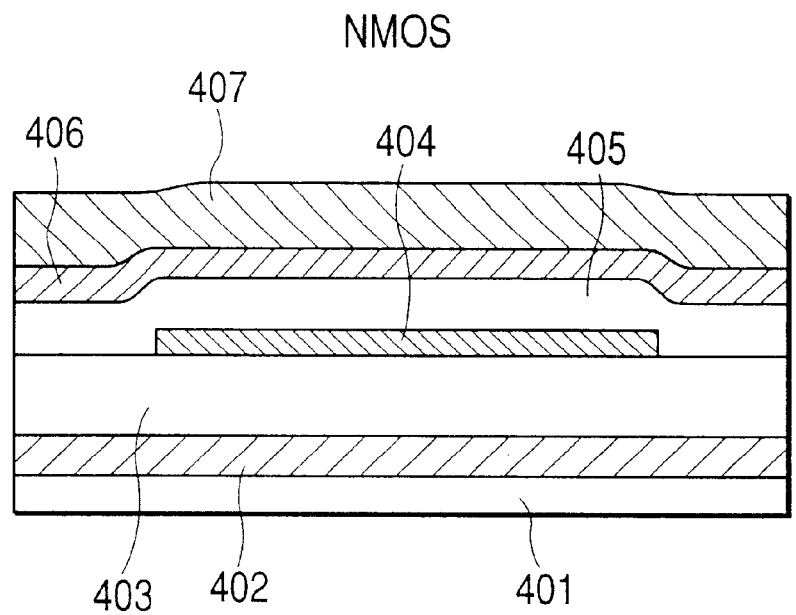
FIGS. 17(a) and 17(b) are cross-sectional views of one step in the order of manufacturing steps for one embodiment of a second TFT according to this invention.
Figure 17B:
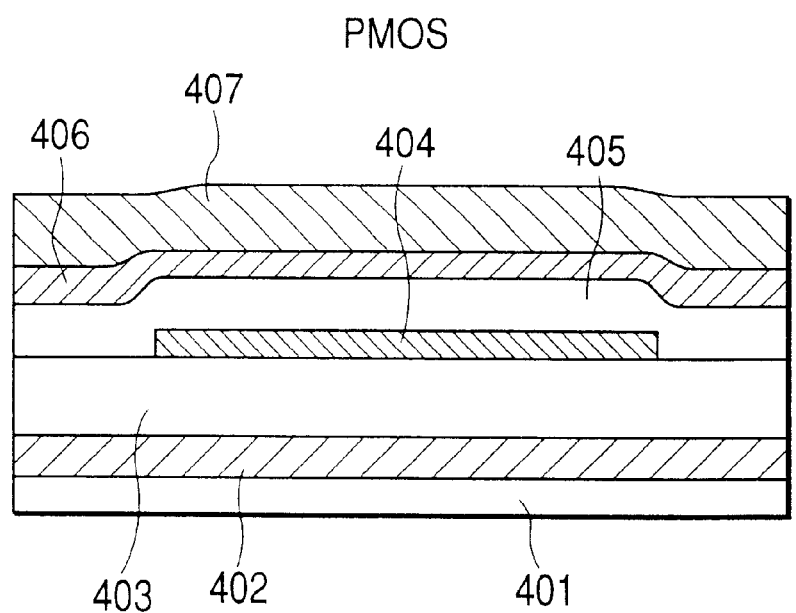

FIG. 17 shows a flow of manufacturing a GOLD type CMOS TFT manufactured by applying this invention. An SiN film 402 and $SiO_2$ film 403 were formed as an under layer to 100 nm and 200 nm thickness, respectively, on a glass substrate 401 by a PE-CVD method. Subsequently, an a-Si (amorphous silicon) film 404 was deposited by 50 nm by a PE-CVD method, and the a-Si film was annealed by excimer laser to form a poly-Si film (poly-silicon). The film was formed into an island shape to a desired position by dry etching using a resist mask. Subsequently, a gate insulation film of 100 nm thickness was formed covering the island shape poly-Si film by a PE-CVD method. The gate electrode had a two-layered structure in which titanium nitride (TiN) 406 was formed as a lower electrode to 30 nm thickness by a sputtering method and then tungsten (W) 407 was formed to 150 nm thickness as an upper layer electrode also by a sputtering method (FIG. 17).

Figure 18A:
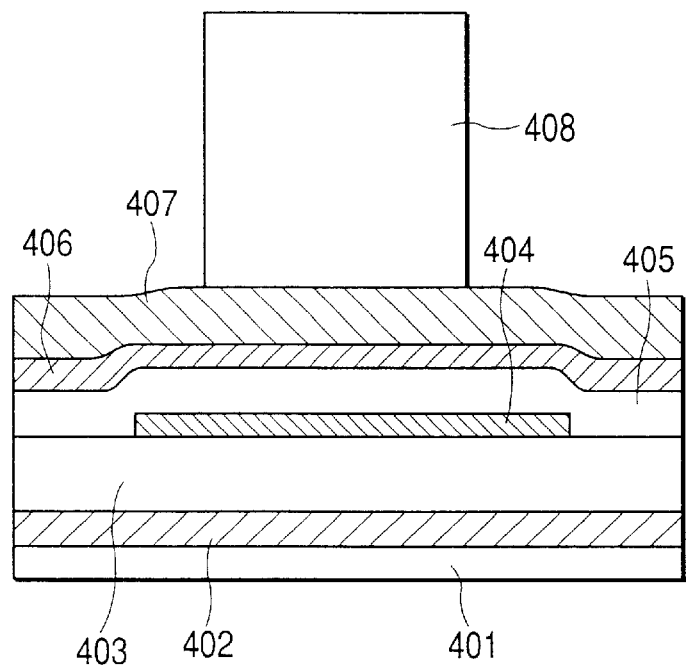
FIGS. 18(a) and 18(b) are cross-sectional views of another step in the order of manufacturing steps for one embodiment of a second TFT according to this invention.
Figure 18B:
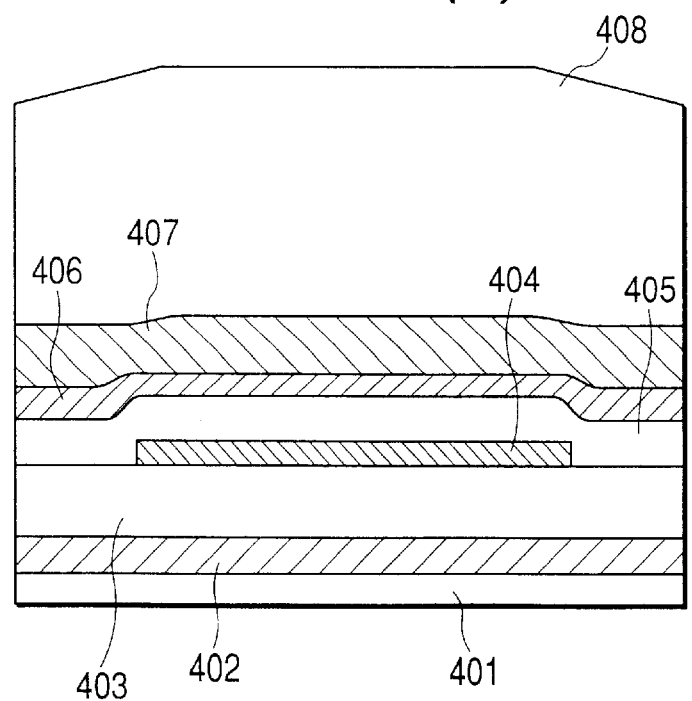
Figure 19A:
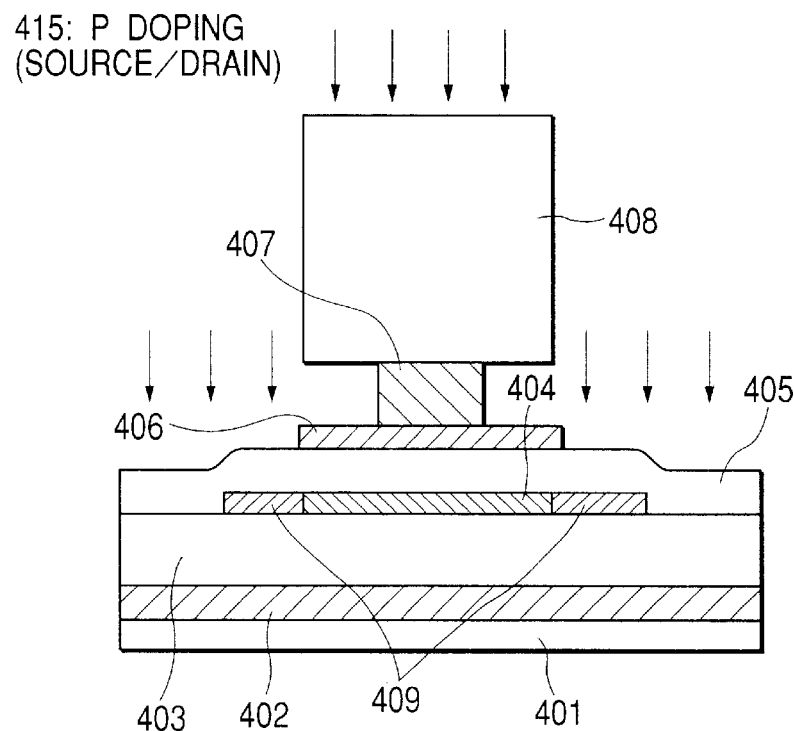
FIGS. 19(a) and 19(b) are cross-sectional views of a further step in the order of manufacturing steps for one embodiment of a second TFT according to this invention.
Figure 19B:
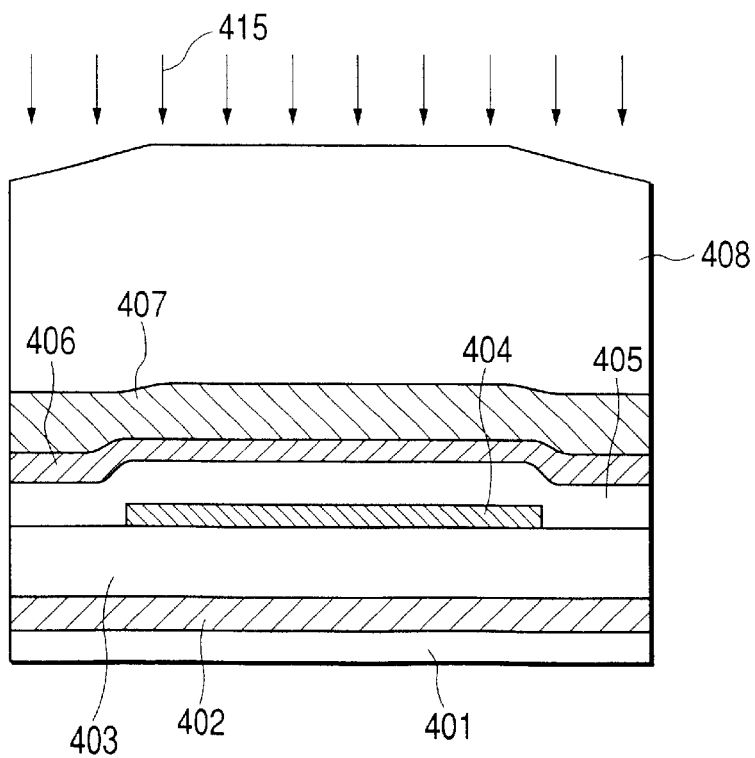

In this embodiment, the NMOS region was formed at first and then the PMOS region was formed. After the steps described above, a photo-resist pattern 408 is formed for the electrode process of the NMOS transistor (FIG. 18). Then, for the thus prepared substrate, the upper layer electrode was treated so as to form a side etching of 0.5 $\mu$m relative to the resist size (FIG. 19) with an isotropic dry etching using $SF_6$ and oxygen ($O_2$) (FIG. 19). In this case, TiN as the lower layer electrode is scarcely etched since dry etching rate is extremely slow and it serves as a protection film for underlying $SiO_2$ upon the side etching.

Successively, TiN was treated with anisotropic dry etching so as to be a substantially identical size relative to the resist by using a chlorine gas ($Cl_2$). Combination of the upper layer electrode and the lower layer electrode is not restricted only to W and TiN in this embodiment. In principle, any material may be used as a lower layer electrode providing that the material has a lower etching rate than the upper layer electrode under the dry etching condition applied for the dry etching of the upper layer electrode. Any material can be used so long as the etching rate is about ⅓ or less, preferably, ⅕ or less for the etching rate of the upper layer electrode. In this case, since the side etching length for the upper layer electrode can be made longer as the difference of the etching rate is greater, TFT of higher reliability can be obtained. Further, since the scattering of the finished film thickness of the lower layer electrode can also be decreased, the concentration in poly-Si can be controlled also easily upon ion implantation through the lower electrode, so that TFT of uniform characteristics can be obtained. For the combination of the electrodes, W, Mo or alloy of W and Mo, Ta, an alloy of Ta and Mo and an alloy of Ta and W is suitable for the upper layer. TiN, Cr, alloy of Cr or Mo and AlN layer is suitable for the lower electrode. In particular, in the combination of various kinds of conductors, the gate electrode can be formed into a preferred convex shape by etching the upper layer electrode with $SF_6$ or a gas mixture of $SF_6$ and $O_2$ while etching the lower layer electrode with a chlorine (Cl) type gas of a gas mixture of chlorine ($Cl_2$) and $O_2$.

The processing method for the electrode is not restricted only to the dry etching but it may be processed by a method of wet etching and a combination of wet etching and dry etching. In this case, a convex electrode shape can be obtained by using electrode materials and etching solution of different etching speeds between the upper layer electrode and the lower layer electrode. In particular, the LDD length can be controlled at a high accuracy when the upper electrode is fabricated by wet etching and the lower layer electrode is treated with anisotropic dry etching. In this case, Mo, W, Al or an alloy thereof is suitable to the upper layer electrode, while Cr, Ti or an alloy containing them is suitable to the lower layer electrode.

Further, the upper layer electrode and the lower layer electrode can be etched by an identical etching solution and a convex electrode shape can be obtained by once-processing by the use of metals and etching solutions in which the etching speed for the upper layer electrode is faster than that for the lower layer electrode.

After the steps described above, $P^+$ ions were ion implanted at 80 keV with a dose of $1E15/cm^3$ using the resist 408 as a mask for ion implantation 415, to conduct doping to the source-drain regions 409 of the NMOS transistor (FIG. 19).

Figure 20A:
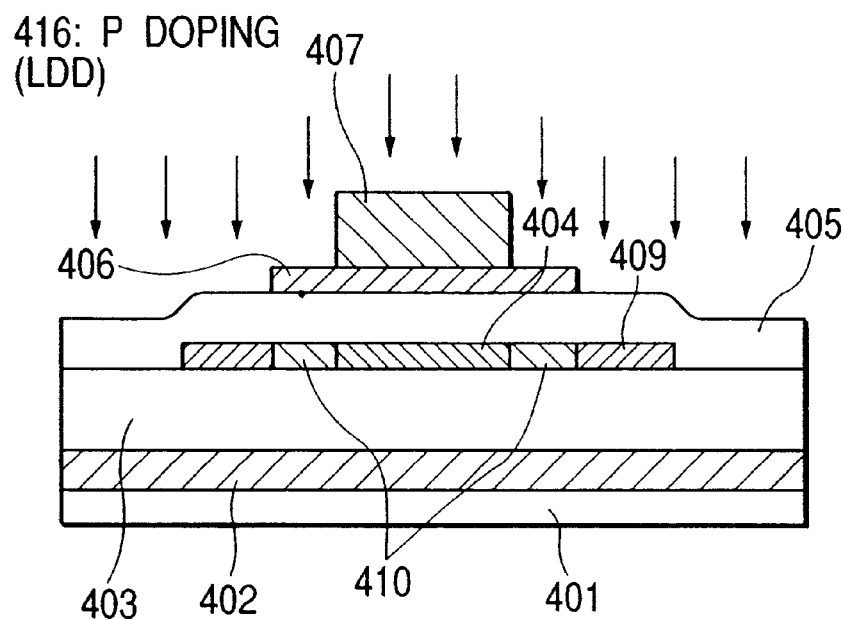
FIGS. 20(a) and 20(b) are cross-sectional views of a further step in the order of manufacturing steps for one embodiment of a second TFT according to this invention.
Figure 20B:
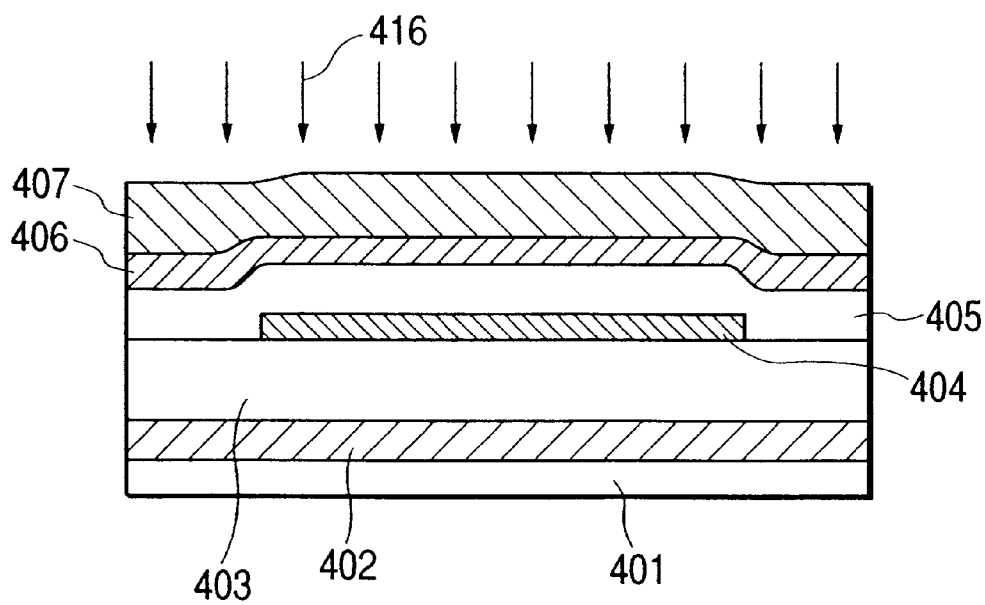

During the electrode process and the ion implantation, the PMOS transistor region is masked by the resist. After the ion implantation, the resist was removed by $O_2$ plasma ashing. In this state, $P^+$ ions were ion implanted at energy of 50 keV to 170 keV (416) to conduct doping to the LDD region 410 (FIG. 20). In this case, a TFT was also manufactured by conducting LDD ion implantation and source-drain ion implantation simultaneously after the electrode fabrication as a comparison with this invention. Ions were implanted under the condition of using $P^+$ ions at 80 keV with a dose of $1 \times 10^{15}/cm^3$.

Figure 21A:
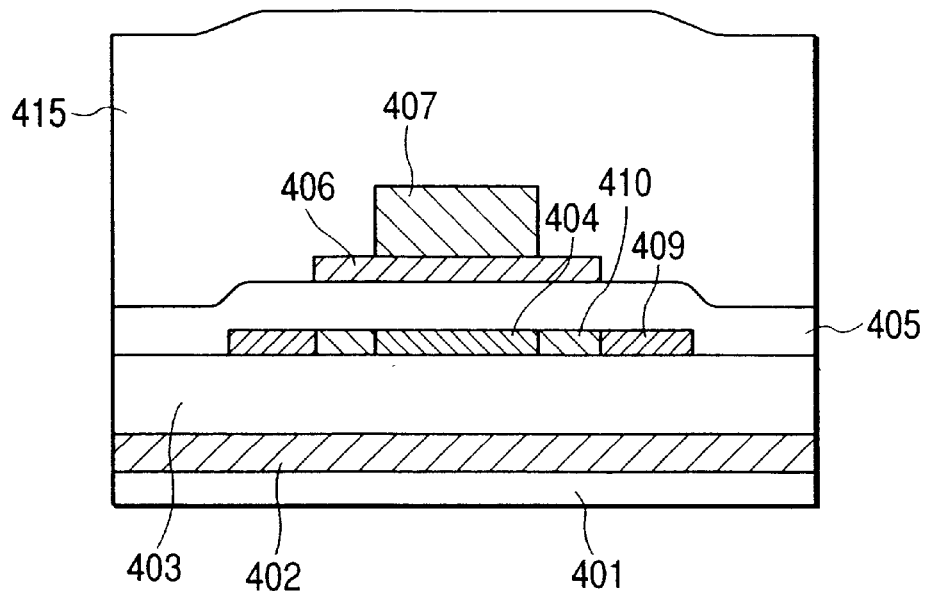
FIGS. 21(a) and 21(b) are cross-sectional views of a further step in the order of manufacturing steps for one embodiment of a second TFT according to this invention.
Figure 21B:
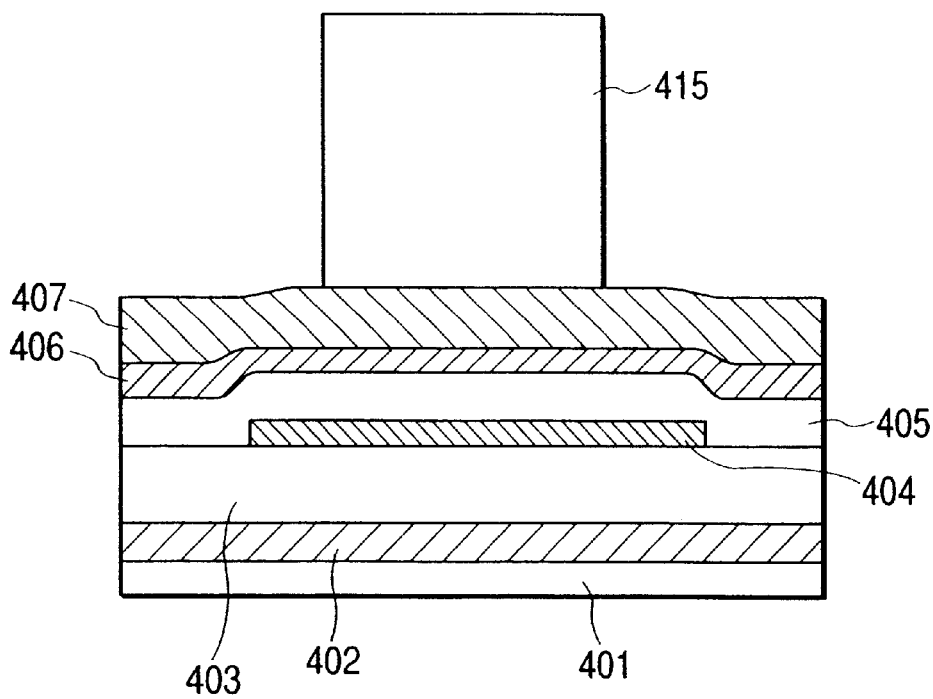

Next, formation of the PMOS region is to be described. Succeeding to the step of manufacturing the NMOS transistor described above, the process goes to the formation of the PMOS region. A resist pattern 415 for electrode processing of the PMOS transistor was formed on the substrate prepared up to this step (FIG. 21). Then, the upper layer and lower layer gate electrodes were treated with the so-called anisotropic dry etching. Dry etching was used in this case by the same reason as in Embodiment 1.

Figure 22A:
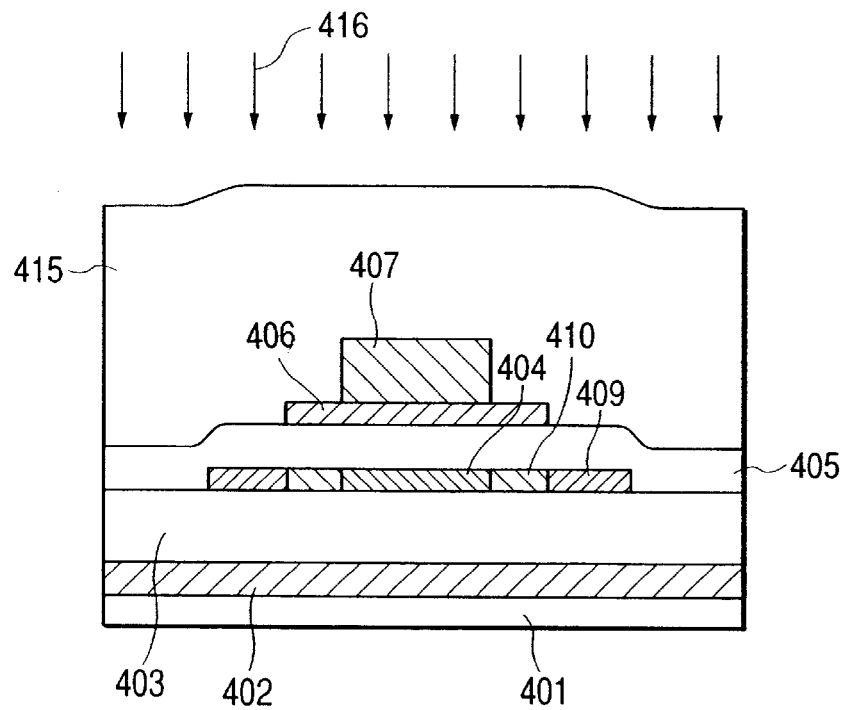
FIGS. 22(a) and 22(b) are cross-sectional views of a further step in the order of manufacturing steps for one embodiment of a second TFT according to this invention.
Figure 22B:
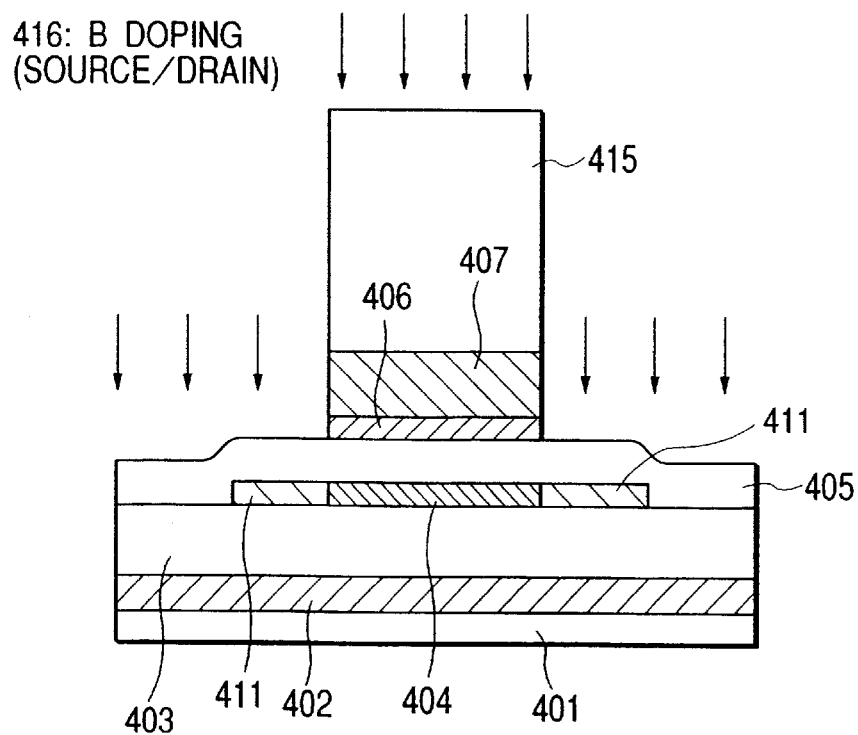
Figure 23A:
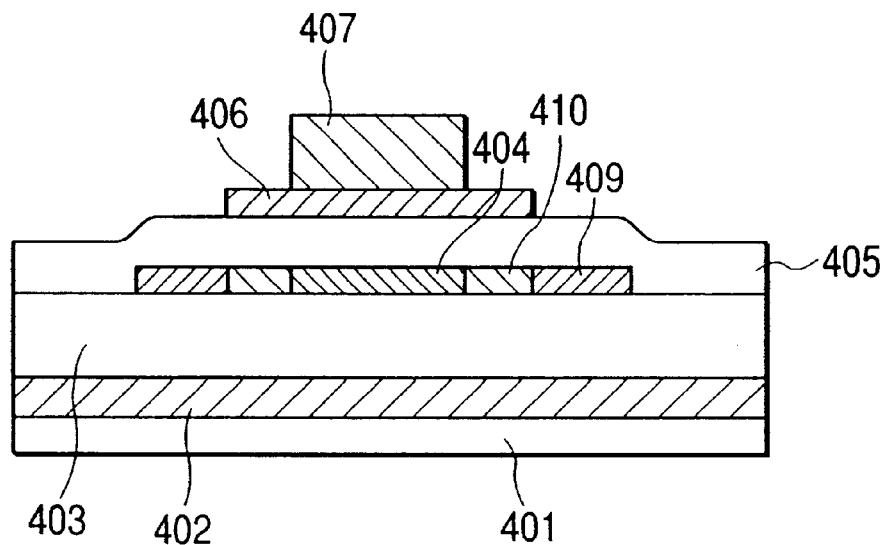
FIGS. 23(a) and 23(b) are cross-sectional views of a further step in the order of manufacturing steps for one embodiment of a second TFT according to this invention.
Figure 23B:
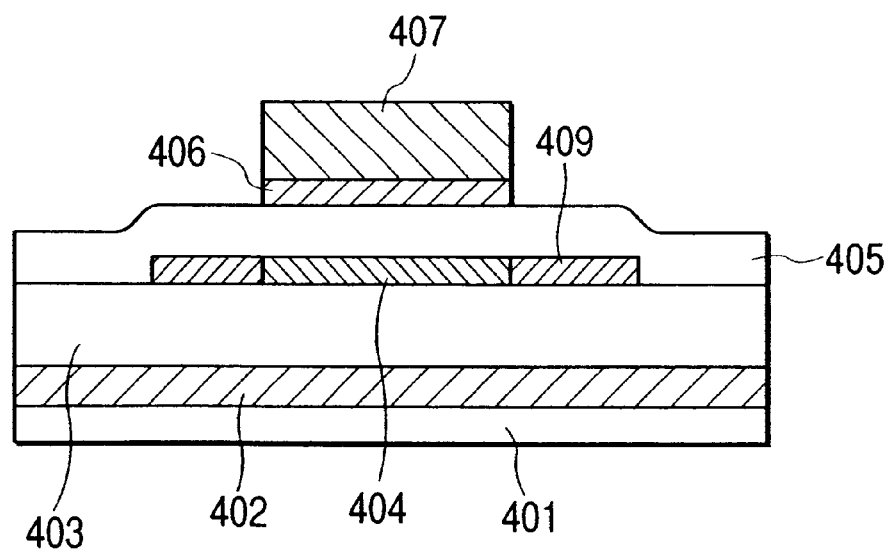

After the fabrication, $B^+$ ions were ion implanted at energy of 25 keV with a dose of $8E14/cm^3$ (416) to form source-drain regions 411 of a PMOS transistor (FIG. 22). Then, the photoresist 415 was removed (FIG. 23). Heat treatment for the activation of the impurity was conducted by annealing at 600° C. for 5 hours in a nitrogen atmosphere.

After forming the TFT, wirings and transparent electrode were formed in the same manner as in Embodiment 1 to manufacture a transistor for use in liquid crystal driving and a CMOS transistor for use in circuits. Subsequently, step for the liquid crystal was conducted to manufacture a pixel portion of LCD. Since the steps are basically identical with those in Embodiment 1, details are omitted.

Figure 24:
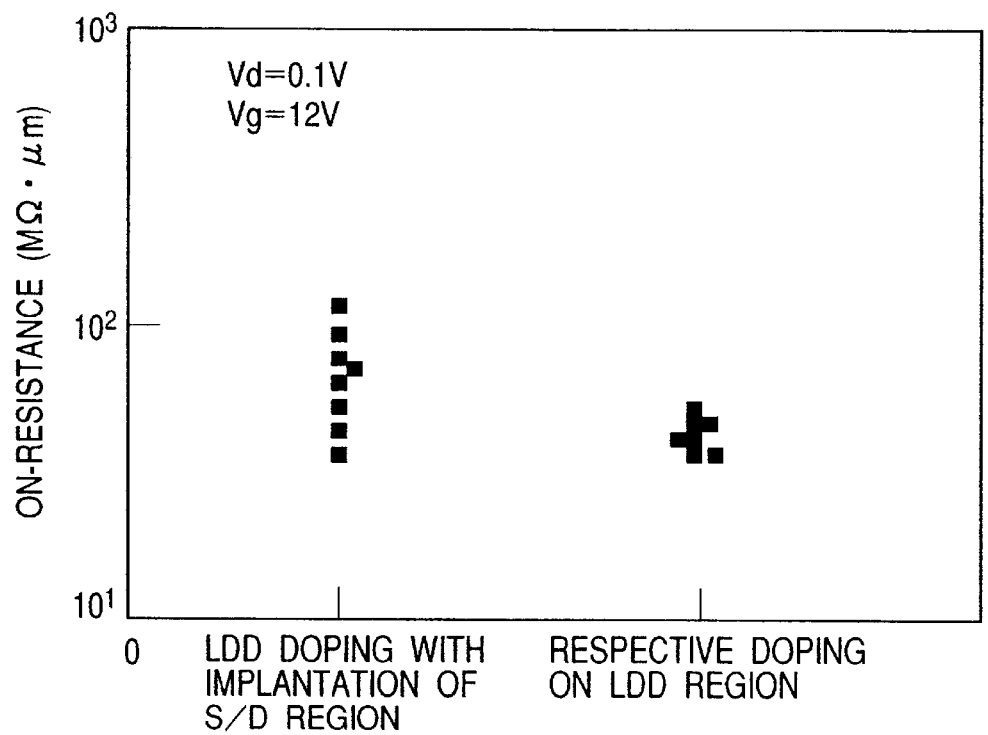
FIG. 24 is a graph illustrating variation of ON-current in an example of a second TFT according to this invention.

FIG. 24 shows results of measuring the ON-resistance of the GOLD type TFT manufactured by the method described above within the plane of the substrate. The ordinate indicates the ON-resistance. The figure shows the experimental results of several devices. It can be seen that when LDD and source and drain were formed by collective ion implantation, the ON-resistance scattered by 50% or more, whereas the scattering was extremely reduced when LDD ion implantation and source-drain ion implantation were conducted separately. This is because the concentration in the LDD portion changes greatly due to the scattering in the lower layer film thickness in collective ion implantation, whereas it less suffers from the effect of the scattering in the lower layer thickness by conducting ion implantation to the LDD portion separately. Accordingly, when ion implantation is conducted using a film other than the gate insulation film as a through film as in this embodiment, it is effective to conduct ion implantation separately to the LDD portion.

Figure 25:
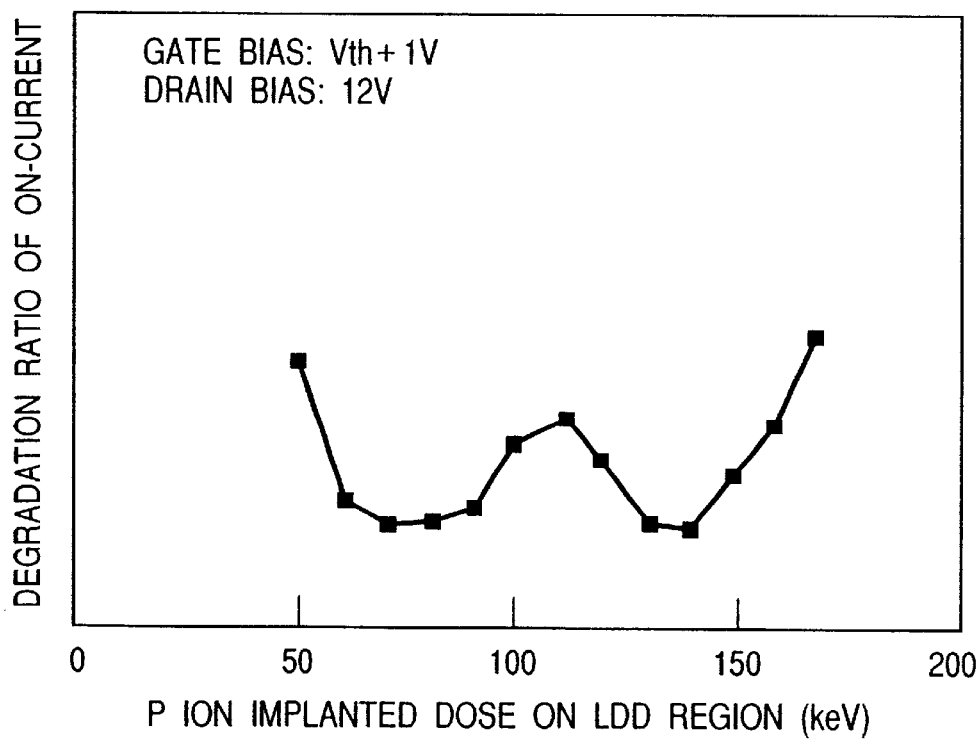
FIG. 25 is a graph showing the results of measurement for the reliability of a second TFT according to this invention.

FIG. 25 shows results of a stress test on the TFT thus manufactured. The stress condition comprises a gate voltage higher than Vth by 1 V and the drain voltage of 12 V as shown in the drawing. The abscissa indicates energy upon ion implantation to the LDD portion while the ordinate indicates the ratio of the ON-current to the initial ON-current after applying stress for 1000 sec.

As can be seen from FIG. 25, the reliability of TFT according to this invention shows dependency on the LDD ion implantation energy as in Embodiment 1. However, in the case of the GOLD structure, since the ion implantation to LDD is conducted through the TiN film, the energy at which the reliability is improved is shifted to the higher energy region compared with the example of Embodiment 1. In this embodiment, TFT of higher reliability could be obtained by setting the ion implantation energy to the LDD portion, for example, to 60 KeV to 90 KeV, 130 KeV–140 KeV.

As has been described above, in a case of manufacturing TFT of the GOLD structure, TFT of uniform characteristics can be obtained by conducting ion implantation to the LDD portion separately, and TFT of high reliability can be obtained by finely controlling the energy as in the embodiments described above. The doping method for the LDD portion is not restricted to the ion implantation but the same effect can be obtained also by using non-mass separation type ion doping by optimizing the ion doping energy.

As shown in each of the embodiments described above, according to this invention, damage introduced upon doping to the LDD can be decreased to obtain TFT of high reliability and obtain LCD of long life.

In the TFT of GOLD structure, TFT of uniform device characteristics can be obtained by conducting doping to the LDD portion separately from the doping to the source and drain regions. Further, TFT of high reliability can be obtained and LCD of long life can be manufactured by controlling the concentration profile of the LDD portion like that in Embodiment 1.

According to this invention, low temperature polysilicon TFT capable of ensuring high reliability for a long period of time can be obtained. Further, this invention can consistently provide low temperature polysilicon TFT capable of ensuring high reliability for a longer period of time and, according to this invention, LCD of high reliability can thus be supplied consistently.

What is claimed is:

1. A thin film transistor mounted on an insulator substrate, comprising a semiconductor thin film, a gate insulation film formed in contact with the semiconductor thin film and a gate electrode, wherein the semiconductor thin film includes a first impurity region and a second impurity region opposed to each other and a third impurity region disposed adjacent to at least one of the first impurity region and the second impurity region, and an impurity concentration in the third impurity region is lower than an impurity concentration in the first impurity region or the second impurity region, and wherein a concentration distribution of the impurity concentration in the third impurity region in a direction crossing the insulator substrate is minimum or maximum near an interface between the gate insulation film and the semiconductor thin film.

2. A thin film transistor mounted on an insulator substrate, comprising a semiconductor thin film, a gate insulation film formed in contact with the semiconductor thin film and a gate electrode, wherein the semiconductor thin film includes a first impurity region and a second impurity region opposed to each other and a third impurity region disposed adjacent to at least one of the first impurity region and the second impurity region, and an impurity concentration in the third impurity region is lower than an impurity concentration in the first impurity region or the second impurity region, and wherein a concentration distribution of the impurity concentration in the third impurity region in a direction crossing the insulator substrate is minimum or maximum near an interface between the insulator substrate and the semiconductor thin film.

3. A thin film transistor as defined in claim 1, wherein a portion of projection of the gate electrode overlaps the third impurity region.

4. A thin film transistor mounted on an insulator substrate, comprising at least one insulation layer between the insulator substrate and the thin film transistor, a semiconductor thin film, a gate insulation film formed in contact with the semiconductor thin film, and a gate electrode, wherein the semiconductor thin film includes a first impurity region and a second impurity region opposed to each other and a third impurity region disposed adjacent to at least one of the first impurity region and the second impurity region, and an impurity concentration in the third impurity region is lower than an impurity concentration in the first impurity region or the second impurity region, and wherein a concentration distribution of the impurity concentration in the third impurity region in a direction crossing the insulator substrate is minimum or maximum near an interface between the gate insulation film and the semiconductor thin film.

5. A thin film transistor mounted on an insulator substrate, comprising at least one insulation layer between the insulator substrate and the thin film transistor, a semiconductor thin film, a gate insulation film formed in contact with the semiconductor thin film, and a gate electrode, wherein the semiconductor thin film includes a first impurity region and a second impurity region opposed to each other and a third impurity region disposed adjacent to at least one of the first impurity region and the second impurity region, and an impurity concentration in the third impurity region is lower than an impurity concentration in the first impurity region or the second impurity region, and wherein a concentration distribution of the impurity concentration in the third impurity region in a direction crossing the insulator substrate is minimum or maximum near an interface between the insulation layer and the semiconductor thin film.

6. A thin film transistor as defined in claim 4, wherein a portion of projection of the gate electrode overlaps the third impurity region.

7. A thin film transistor mounted on an insulator substrate, comprising a semiconductor thin film formed in contact with the insulator substrate, a gate insulation film formed in contact with the semiconductor thin film, and a gate electrode, wherein the semiconductor thin film includes a first impurity region and a second impurity region opposed to each other and a third impurity region disposed adjacent to at least one of the first impurity region and the second impurity region, and an impurity concentration in the third impurity region is lower than an impurity concentration in the first impurity region or the second impurity region, and wherein a concentration distribution of the impurity concentration in the third impurity region in a direction crossing the insulator substrate is minimum near an interface between the gate insulation film and the semiconductor thin film and is maximum near an interface between the insulator substrate and the semiconductor thin film.

8. A thin film transistor mounted on an insulator substrate, comprising a semiconductor thin film formed in contact with the insulator substrate, a gate insulation film formed in contact with the semiconductor thin film, and a gate electrode, wherein the semiconductor thin film includes a first impurity region and a second impurity region opposed to each other and a third impurity region disposed adjacent to at least one of the first impurity region and the second impurity region, and an impurity concentration in the third impurity region is lower than an impurity concentration in the first impurity region or the second impurity region, and wherein a concentration distribution of the impurity concentration in the third impurity region in a direction crossing the insulator substrate is maximum near an interface between the gate insulation film and the semiconductor thin film and is minimum near an interface between the insulator substrate and the semiconductor thin film.

9. A thin film transistor as defined in claim 7, wherein a portion of projection of the gate electrode overlaps the third impurity region.

10. A thin film transistor mounted on an insulator substrate, comprising at least one insulation layer formed between the insulator substrate and the thin film transistor, a semiconductor thin film formed in contact with the insulation layer, a gate insulation film formed in contact with the semiconductor thin film and a gate electrode, wherein the semiconductor thin film has a first impurity region and a second impurity region opposed to each other and has a third impurity region disposed adjacent to at least one of the first impurity region and the second impurity region, and an impurity concentration in the third impurity region is lower than an impurity concentration in the first impurity region or the second impurity region, and wherein a concentration distribution of the impurity concentration in the third impurity region in a direction crossing the insulator substrate is minimum near an interface between the gate insulation film and the semiconductor thin film and is maximum near an interface between the insulation layer and the semiconductor thin film.

11. A thin film transistor mounted on an insulator substrate, comprising at least one insulation layer formed between the insulator substrate and the thin film transistor, a semiconductor thin film formed in contact with the insulation layer, a gate insulation film formed in contact with the semiconductor thin film and a gate electrode, wherein the semiconductor thin film has a first impurity region and a second impurity region opposed to each other and has a third impurity region disposed adjacent to at least one of the first impurity region and the second impurity region, and an impurity concentration in the third impurity region is lower than an impurity concentration in the first impurity region or the second impurity region, and wherein a concentration distribution of the impurity concentration in the third impurity region in a direction crossing the insulator substrate is maximum near an interface between the gate insulation film and the semiconductor thin film and is minimum near an interface between the insulation layer and the semiconductor thin film.

12. A thin film transistor as defined in claim 14, wherein a portion of projection of the gate electrode overlaps the third impurity region.

13. A thin film transistor as defined in claim 2, wherein a portion of projection of the gate electrode overlaps the third impurity region.

14. A thin film transistor as defined in claim 5, wherein a portion of projection of the gate electrode overlaps the third impurity region.

15. A thin film transistor as defined in claim 8, wherein a portion of projection of the gate electrode overlaps the third impurity region.

16. A thin film transistor as defined in claim 11, wherein a portion of projection of the gate electrode overlaps the third impurity region.

17. A thin film transistor device comprising a thin film transistor mounted on an insulator substrate, the thin film transistor comprising a semiconductor thin film, a gate insulation film overlying the semiconductor thin film, and a gate electrode, wherein the semiconductor thin film includes a first impurity region and a second impurity region opposed to each other and a third impurity region disposed adjacent to at least one of the first and second impurity regions, an impurity concentration in the third impurity region is lower than an impurity concentration in the first impurity region or the second impurity region, and an impurity concentration distribution of the third impurity region in a thickness direction of the semiconductor thin film has a peak shifted substantially from a center of the third impurity region in the thickness direction.

18. A thin film transistor device as defined in claim 17, wherein the concentration peak is near an interface of the semiconductor thin film with an adjacent layer of the device.

19. A thin film transistor device as defined in claim 18, wherein the adjacent layer is the gate insulation film.

20. A thin film transistor device as defined in claim 18, wherein the adjacent layer is the insulator substrate.

21. A thin film transistor device as defined in claim 18, wherein the adjacent layer is an insulation layer between the insulator substrate and the thin film transistor.

22. A thin film transistor device as defined in claim 18, wherein the impurity concentration in the third impurity region is minimum near an interface of the semiconductor thin film with a second adjacent layer of the structure on a side of the semiconductor thin film opposite from the first-mentioned adjacent layer.

23. A thin film transistor device as defined in claim 22, wherein the impurity concentration of the third impurity region increases continuously from the minimum to the peak.

24. A thin film transistor device as defined in claim 18, wherein the peak is within about $1/5$ of the thickness of the semiconductor thin film from the interface.

25. A thin film transistor device as defined in claim 17, wherein a portion of projection of the gate electrode overlaps the third impurity region.

* * * * *